United States Patent [19]

Nakamura et al.

[11] Patent Number: 5,049,477

[45] Date of Patent: Sep. 17, 1991

[54] RADIATION RESPONSIVE COMPOSITION

[75] Inventors: Koki Nakamura; Masayoshi Tsuboi; Keizo Koya, all of Kanagawa, Japan

[73] Assignee: Fuji Photo Film Co., Ltd., Kanagawa, Japan

[21] Appl. No.: 338,089

[22] Filed: Apr. 14, 1989

[30] Foreign Application Priority Data

Apr. 15, 1988 [JP] Japan ........................ 63-92801

[51] Int. Cl.⁵ ........................ G03C 1/54; G03F 7/004

[52] U.S. Cl. ........................ 430/270; 430/170; 430/179; 430/194; 430/196; 430/334; 430/336; 430/495

[58] Field of Search ............... 430/495, 194, 196, 170, 430/179, 334, 336, 495, 270

[56] References Cited

U.S. PATENT DOCUMENTS

| | | | |
|---|---|---|---|
| 3,887,374 | 6/1975 | Brongo et al. | 430/170 |
| 4.273,860 | 6/1981 | Adin | 430/495 |
| 4,314,019 | 2/1982 | Adin | 430/495 |

*Primary Examiner*—Charles L. Bowers, Jr.
*Assistant Examiner*—John S. Y. Chu
*Attorney, Agent, or Firm*—Sughrue, Mion, Zinn, Macpeak & Seas

[57] ABSTRACT

A radiation responsive composition containing a compound represented by the following formula (I) and a photoreducing agent capable of forming a redox couple together with said compound for many uses, e.g., image formation, etching, plating, etc.:

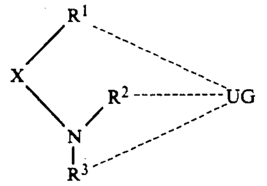

(I)

wherein N represents a nitrogen atom; X represents an oxygen atom (—O—), a sulfur atom (—S—), or a nitrogen-containing group of formula,

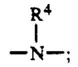

$R^1$, $R^2$, $R^3$ and $R^4$ each represents a mere bond, a substituted or unsubstituted alkyl, aryl, heterocyclic, acyl, aralkyl, alkenyl, alkynyl or carbamoyl group, or a sulfonyl group into which a substituted or unsubstituted alkyl or aryl group has been introduced, provided that at least one of the substituents $R^1$ to $R^3$ be a substituted or unsubstituted aryl or heterocyclic group and that two or more of $R^1$, $R^2$ and $R^3$, or of $R^1$, $R^2$, $R^3$ and $R^4$ when X represents a nitrogen containing group of formula,

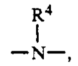

may be taken together to form a ring; UG represents a group to be released from said compound of formula (I) taking advantage of the N—X bond cleavage as a trigger, which takes place when a redox couple is formed between said compound of formula (I) and the photoreducing agent irradiated with radiant rays; and the solid lines represent bonds, while broken lines indicate that a bond may or may not be present, but at least one of the broken lines forms a bond.

20 Claims, No Drawings

RADIATION RESPONSIVE COMPOSITION

FIELD OF THE INVENTION

This invention relates to a radiation responsive material.

BACKGROUND OF THE INVENTION

Many photofunctioning materials are known which perform their functions due to irradiation with light or other radiation. These materials can be grouped into classes according to their respective working mechanisms.

For instance, there have been known materials which themselves function as photosensors to accept light energy to be used effectively in a succeeding process, those which themselves undergo a photoreaction to produce useful compounds, e.g., dyes or the like (or to make it impossible to produce useful compounds), and those which, for effective use, undergo a photoreaction to cause remarkable physical changes. Representative materials functioning as photosensors are silver halides in silver salt photography and photoconductors in electrophotography, both being photographic systems having a steadfast position excellent in the image-forming arts. Still, these systems have problems, e.g., such that they require complicated processings for image formation and that they are of complex design when used for full-colored image formation. Therefore, more simplified image-forming methods have been desired.

As for the utilization of photofunctioning materials of the kind which undergo a photoreaction to produce or to destroy useful substances, there are known a color image-forming method in which a radical photographic composition, e.g., one which comprises a diazonium salt or an azide compound, carbon tetrabromide and an aromatic amine, is utilized as a light-sensitive material, an image-forming method utilizing a photoionizing reaction of an organometallic compound or a charge transfer complex, and so on. However, materials belonging to this class have problems in that they are, in general, poor in stability and limited in useful substances to be produced therefrom.

On the other hand, as image-forming systems utilizing a photoredox reaction there have been reported those using the combination of cobalt(III) complexes and photoreducing agents (JP-A-50-139722, JP-A-50-139723 and JP-A-50-139724 (the term "JP-A" as used herein refers to a "published unexamined Japanese patent application")), those using the combination of tellurium (IV) compounds and photoreducing agents (JP-A-50-45622 and JP-A-50-150427), those using the combination of copper complexes and photoreducing agents (U.S. Pat. Nos. 3,859,092, 3,860,500 and 3,860,501), and so on. In the photoredox reaction, materials are to remain stable, and the system utilizing the combination of a compound represented by formula (I) in this invention as defined hereinbelow and a photoreducing agent to form a redox couple through the photoredox reaction has more extensive functions than those according to conventional arts.

As for the photofunctioning materials of the kind which cause a remarkable physical change as the result of photoreaction, a wide variety of materials have been known. Examples of photomechanical light-sensitive resins which have been used in practice include systems using a bichromate as a photosensitive material, systems utilizing the photo-crosslinking reaction of polyvinyl cinnamate, systems using a mixture of an azide compound and a novolak resin, systems using the combination of a photopolymerization initiator and a vinyl monomer, systems using a polymeric diazonium salt, systems using the combination of an o-quinonediazide and a novolak resin, systems using a silicone resin into which acryloyl or cinnamoyl groups have been introduced in the side chains thereof, and so on. Besides being used as photomechanical materials, these photosensitive materials can be used as UV hardenable inks, coating materials and so on. Most of the materials belonging to this class are polymerized or crosslinked by the photoreaction to result in conversion into insoluble matters. Contrary thereto, among materials which are converted into soluble matters by optical exposure, or so-called positive-working photosensitive materials, those which are sensitive to UV rays and useful in practice are o-quinonediazides alone at present. Under these circumstances, the emergence of novel positive-working photosensitive materials has been expected.

SUMMARY OF THE INVENTION

An object of this invention is to provide a radiation responsive material which can perform various functions through irradiation with radiant rays.

The above-described object of this invention is attained with a radiation responsive composition comprising a compound represented by the following formula (I) and a photoreducing agent capable of forming a redox couple together with said compound:

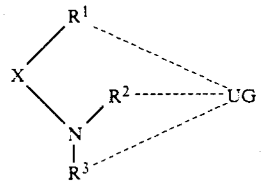

(I)

wherein N represents a nitrogen atom; X represents an oxygen atom (—O—), a sulfur atom (—S—), or a nitrogen-containing group of formula,

$R^1$, $R^2$, $R^3$ and $R^4$ each represents a mere bond, a substituted or unsubstituted alkyl, aryl, heterocyclic, acyl, aralkyl, alkenyl, alkynyl or carbamoyl group, or a sulfonyl group into which a substituted or unsubstituted alkyl or aryl group has been introduced, provided that at least one of the substituents $R^1$ to $R^3$ be a substituted or unsubstituted aryl or heterocyclic group and that two or more of $R^1$, $R^2$ and $R^3$, or of $R^1$, $R^2$, $R^3$ and $R^4$ when X represents a nitrogen containing group of formula,

may be taken together to form a ring; UG represents a group to be released from said compound of formula (I) taking advantage of the N—X bond cleavage as a trigger, which takes place when a redox couple is formed between said compound of formula (I) and said photoreducing agent irradiated with radiant rays; and the solid lines represent bonds, while broken lines indicate that a bond may or may not be present, but at least one of the broken lines forms a bond.

DETAILED DESCRIPTION OF THE INVENTION

At least either $R^1$ or $R^3$ is preferably an aryl group or a heterocyclic group, more preferably an aryl or heterocyclic group substituted by one or more of a group having a positive Hammett's $\lambda_p$.

As examples of substituent groups having a positive Hammett's $\lambda_p$ value, mention may be made of substituted or unsubstituted carbamoyl, sulfonyl, sulfamoyl, alkoxycarbonyl, acyl, ammonio, azo and sulfinyl groups, a nitro group, a cyano group, a trifluoromethyl group, a nitroso group, a fluorine atom, a chlorine atom, and a bromine atom.

Suitable examples of aryl and heterocyclic groups as described above are an aryl group containing from 6 to 30 carbon atoms and a heterocyclic group containing from 1 to 30 carbon atoms, including a phenyl group, a naphthyl group, an anthranyl group, a pyridyl group, a pyrazinyl group, a pyrimidyl group, a benzothiazolyl group, a benzoxazolyl group, an imidazolyl group, a thiazolyl group, an azaindenyl group, an indenyl group, a pyrrolyl group, and a phenylthio group.

Aryl groups preferred as $R^1$ and $R^3$ are those substituted by at least one electron attractive group, with specific examples of $R^1$ and $R^3$ including 4-nitrophenyl group, 2-nitrophenyl group, 2-nitro-4-N-methyl-N-n-octylsulfamoylphenyl group, 2-nitro-4-N-methyl-N-n-hexadecylsulfamoylphenyl group, 2-nitro-4-N-methyl-N-(3-carboxypropyl)sulfamoylphenyl group, 2-nitro-4-N-ethyl-N-(2-sulfoethyl)sulfamoylphenyl group, 2-nitro-4-N-n-hexadecyl-N-(3-sulfopropyl)sulfamoylphenyl group, 2-nitro-4-N-(2-cyanoethyl)-N-[(2-hydroxyethoxy)ethyl]sulfamoylphenyl group, 2-nitro-4-diethylsulfamoylphenyl group, 2-nitro-4-di-n-butylsulfamoylphenyl group, 2-nitro-4-di-n-octylsulfamoylphenyl group, 2-nitro-4-methylsulfamoylphenyl group, 2-nitro-4-n-hexadecylsulfamoylphenyl group, 2-nitro-4-N-methyl-N-(4-dodecylsulfonylphenyl)sulfamoylphenyl group, 2-nitro-4-(3-methylsulfamoylphenyl)sulfamoylphenyl group, 4-nitro-2-N-methyl-N-n-dodecylsulfamoylphenyl group, 4-nitro-2-N-methyl-N-n-octadecylsulfamoylphenyl group, 4-nitro-2-diethylsulfamoylphenyl group, 4-nitro-2-di-n-octadecylsulfamoylphenyl group, 2-nitro-4-chlorophenyl group, 2-nitro-4-N-methyl-N-n-butylcarbamoylphenyl group, 2-nitro-4-N-methyl-N-(3-carboxypropyl)carbamoylphenyl group, 2-nitro-4-diethylcarbamoylphenyl group, 2-nitro-4-di-n-octylcarbamoylphenyl group, 2-nitro-4-methylcarbamoylphenyl group, 2-nitro-4-n-hexadecylcarbamoylphenyl group, 2-nitro-4-N-methyl-N-(4-dodecylsulfonylphenyl)carbamoylphenyl group, 4-nitro-2-N-methyl-N-n-butylcarbamoylphenyl group, 4-nitro-2-N-methyl-N-n-octylcarbamoylphenyl group, 4-nitro-2-N-methyl-N-n-hexadecylcarbamo-ylphenyl group, 4-nitro-2-N-ethyl-N-(2-sulfoethyl)carbamoylphenyl group, 4-nitro-2-n-hexadecylcarbamoylphenyl group, 4-nitro-2-N-methyl-N-(4-dodecylsulfonylphenyl)carbamoylphenyl group, 2,4-dimethanesulfonylphenyl group, 2-methanesulfonyl-4-benzenesulfonylphenyl group, 2-n-octanesulfonyl-4-methanesulfonylphenyl group, 2-n-tetradecanesulfonyl-4-methanesulfonylphenyl group, 2-n-hexadecanesulfonyl-4-methanesulfonylphenyl group, 2,4-di-n-dodecanesulfonylphenyl group, 2,4-didodecanesulfonyl-5-trifluoromethylphenyl group, 2-n-decanesulfonyl-4-cyano-5-trifluoromethylphenyl group, 2-cyano-4-methanesulfonylphenyl group, 2,4,6-tricyanophenyl group, 2,4-dicyanophenyl group, 2-nitro-4-methanesulfonylphenyl group, 2-nitro-4-n-dodecanesulfonylphenyl group, 2-nitro-4-(2-sulfoethylsulfonyl)phenyl group, 2-nitro-4-carboxymethylsulfonylphenyl group, 2-nitro-4-carboxyphenyl group, 2-nitro-4-ethoxycarbonyl-5-n-butoxyphenyl group, 2-nitro-4-ethoxycarbonyl-5-n-hexadecyloxyphenyl group, 2-nitro-4-diethylcarbamoyl-5-n-hexadecyloxyphenyl group, 2-nitro-4-cyano-5-n-dodecylphenyl group, 2,4-dinitrophenyl group, 2-nitro-4-n-decylthiophenyl group, 3,5-dinitrophenyl group, 2-nitro-3,5-dimethyl-4-n-hexadecanesulfonylphenyl group, 4-methanesulfonyl-2-benzenesulfonylphenyl group, 4-n-octanesulfonyl-2-methanesulfonylphenyl group, 4-n-tetradecanesulfonyl-2-methanesulfonylphenyl group, 2,5-didodecanesulfonyl-4-trifluoromethylphenyl group, 4-n-decanesulfonyl-2-cyano-5-trifluoromethylphenyl group, 4-cyano-2-methanesulfonylphenyl group, 4-nitro-2-methanesulfonylphenyl group, 4-nitro-2-n-dodecanesulfonylphenyl group, 4-nitro-2-(2-sulfoethylsulfonyl)phenyl group, 4-nitro-2-carboxymethylsulfonylphenyl group, 4-nitro-2-carboxyphenyl group, 4-nitro-2-ethoxycarbonyl-5-n-hexadecyloxyphenyl group, 4-nitro-2-diethylcarbamoyl-5-n-hexadecyloxyphenyl group, 4-nitro-2-n-decylthiophenyl group, 4-nitro-3,5-dimethyl-2-n-hexadecanesulfonyl group, 4-nitronaphthyl group, 2,4-dinitronaphthyl group, 4-nitro-2-dioctylcarbamoyl-5-(3-sulfobenzenesulfonylamino)naphthyl group, 2,3,4,5,6-pentafluorophenyl group, 2-nitro-4-benzoylphenyl group, 2,4-diacetylphenyl group, 2-nitro-4-trifluoromethylphenyl group, 4-nitro-2-trifluoromethylphenyl group, 4-nitro-3-trifluoromethylphenyl group, 2,4,5-tricyanophenyl group, 3,4-dicyanophenyl group, 2-chloro-4,5-dicyanophenyl group, 2-bromo-4,5-dicyanophenyl group, 4-methanesulfonyl group, 4-n-hexadecanesulfonylphenyl group, 2-decanesulfonyl-5-trifluoromethylphenyl group, 2-nitro-5-methylphenyl group, 2-nitro-5-n-octadecyloxyphenyl group, and 2-nitro-4-N-(vinylsulfonylethyl)-N-methylsulfamoylphenyl group.

Specific examples of heterocyclic groups preferred as $R^1$ and $R^3$ include 2-pyridyl group, 3-pyridyl group, 4-pyridyl group, 5-nitro-2-pyridyl group, 4-nitro-N-hexadecylcarbamoyl-2-pyridyl group, 3,5-dicyano-2-pyridyl group, 5-dodecanesulfonyl-2-pyridyl group, 5-cyano-2-pyridyl group, 4-nitrothiophen-2-yl group, 5-nitro-1,2-dimethylimidazol-4-yl group, 3,5-diacetyl-2-pyridyl group, 1-dodecyl-5-carbamoylpyridinium-2-yl group, 5-nitro-2-furyl group, 5-nitrobenzothiazol-2-yl group, and 2-methyl-6-nitrobenzoxazol-5-yl group.

In analogy with $R^1$ and $R^3$, $R^2$ and $R^4$ each may be an aryl group or a heterocyclic group, and further may represent an acyl group, an alkyl group or a sulfonyl group.

As examples of groups represented by $R^1$, $R^2$, $R^3$ and $R^4$, other than aryl and heterocyclic groups, mention may be made of an alkyl group (preferably containing from 1 to 30 carbon atoms) and an aralkyl group (preferably containing from 7 to 30 carbon atoms) (which may be substituted, with specific examples including methyl, trifluoromethyl, benzyl, chloromethyl, dimethylaminomethyl, ethoxycarbonylmethyl, aminomethyl, acetylaminomethyl, ethyl, 2-(4-dodecanoylaminophenyl)ethyl, carboxyethyl, allyl, 3,3,3-trichloropropyl, n-propyl, isopropyl, n-butyl, isobutyl, sec-butyl, t-butyl, n-pentyl, sec-pentyl, t-pentyl, cyclopentyl, n-hexyl, sec-hexyl, t-hexyl, cyclohexyl, n-octyl, sec-octyl, t-octyl, n-decyl, n-undecyl, n-dodecyl, n-tetradecyl, n-pentadecyl, n-hexadecyl, sec-hexadecyl, t-hexadecyl, n-octadecyl, and t-octadecyl), an alkenyl group (preferably containing from 2 to 30 carbon atoms) (which may be substituted, with specific examples including vinyl, 2-chlorovinyl, 1-methylvinyl, 2-cyanovinyl, cyclohexen-1-yl, etc.), an alkynyl group (preferably containing from 2 to 30 carbon atoms) (which may be substituted, with specific examples including ethynyl, 1-propynyl, and 2-ethoxycarbonylethynyl), an acyl group (preferably containing from 2 to 30 carbon atoms) (which may be substituted, with specific examples including acetyl, propionyl, butyroyl, isobutyroyl, 2,2-dimethylpropionyl, benzoyl, 3,4-dichlorobenzoyl, 3-acetylamino-4-methoxybenzoyl, 4-methylbenzoyl, and 4-methoxy-3-sulfobenzoyl), a sulfonyl group (preferably containing from 1 to 30 carbon atoms) (which may be substituted, with specific examples including methanesulfonyl, ethanesulfonyl, chloromethanesulfonyl, propanesulfonyl, butanesulfonyl, n-octanesulfonyl, n-dodecanesulfonyl, n-hexadecanesulfonyl, benzenesulfonyl, 4-toluenesulfonyl, and 4-n-dodecyloxybenzenesulfonyl), and a carbamoyl group (preferably containing from 1 to 30 carbon atoms) (which may be substituted, with specific examples including carbamoyl, methylcarbamoyl, dimethylcarbamoyl, bis(2-methoxyethyl)carbamoyl, diethylcarbamoyl, cyclohexylcarbamoyl, di-n-octylcarbamoyl, 3-dodecyloxypropylcarbamoyl, hexadecylcarbamoyl, 3-(2,4-di-t-pentylphenoxy)propylcarbamoyl, 3-octanesulfonylaminophenyl and di-n-octadecylcarbamoyl).

Of the compounds represented by formula (I), those of the following formula (II) are preferred over others in this invention:

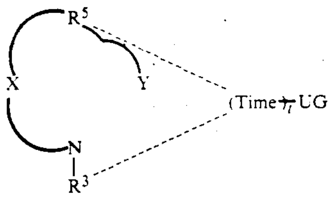

(II)

In the above formula, (Time)$_t$-UG is attached to at least either $R^3$ or $R^5$.

Y is a divalent linkage group, preferably —(C=O)— or —$SO_2$—. X has the same meaning as in the foregoing formula (I).

$R^5$ is attached to X and Y and represents an atomic group necessary for completing a nitrogen-containing 5- to 8-membered single or condensed hetero ring.

Suitable examples of a moiety corresponding to the hetero ring described above are illustrated below.

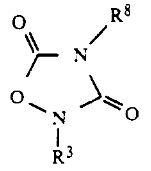
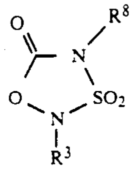
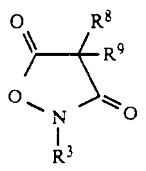
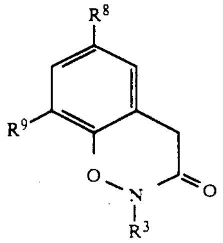
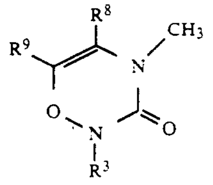
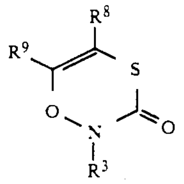
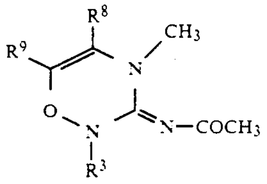
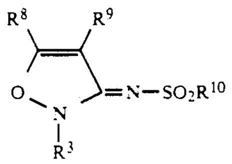
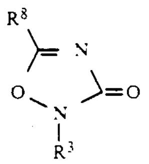
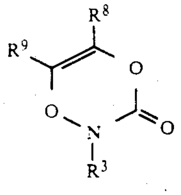
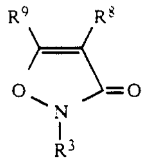
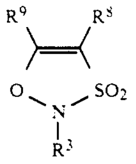
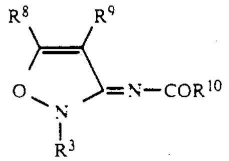
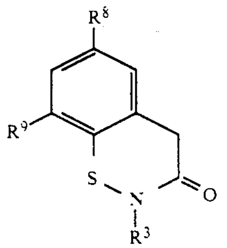
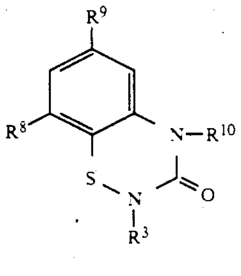
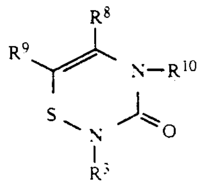

-continued

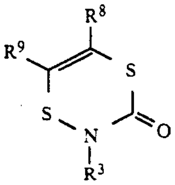
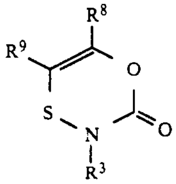
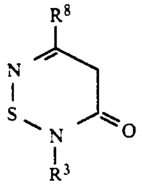
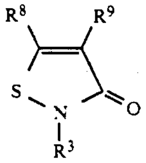
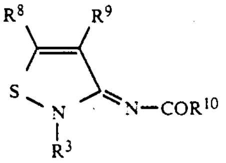
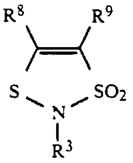
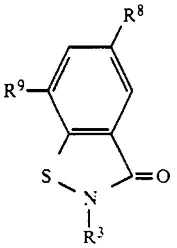
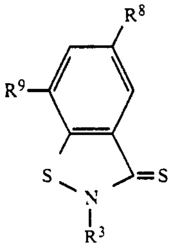
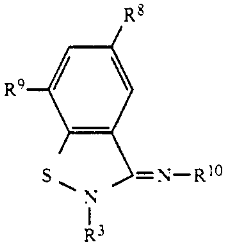
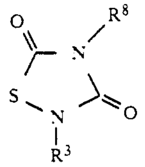
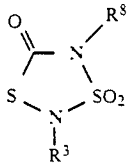
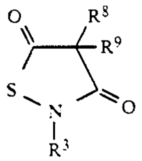
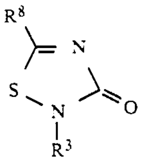
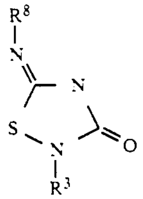
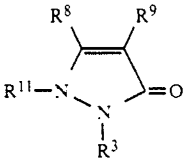
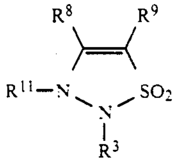
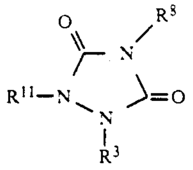
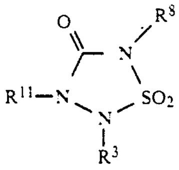
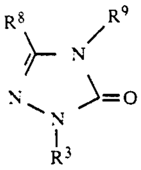
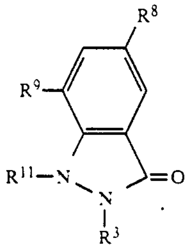
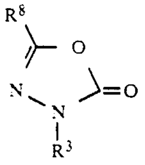

-continued

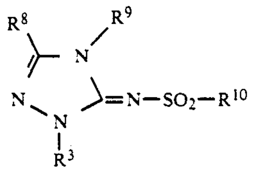
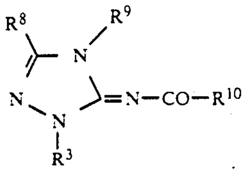
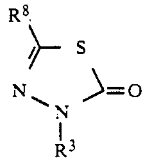
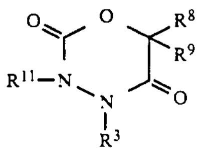
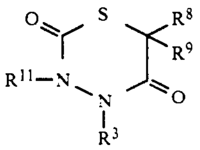
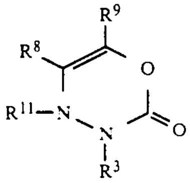
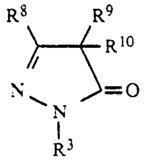
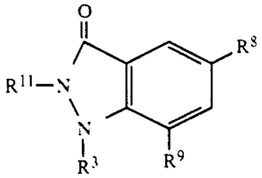

In the foregoing formulae, substituent groups represented by $R^8$, $R^9$ and $R^{10}$ are preferably a hydrogen atom, an alkyl group, an aryl group, or a heterocyclic group.

$R^{11}$ represents an acyl group or a sulfonyl group.

—(Time)$_t$—UG is described in detail below.

Time represents a group capable of releasing UG through a reaction to follow the N—O, N—N or N—S bond cleavage which functions as a trigger and takes place when a redox couple is formed between the compound of formula (I) and the irradiated photoreducing agent.

t represents 0 or 1.

Various groups are known as those represented by Time, with specific examples including those disclosed in JP-A-61-147244 on pages 5 to 7, JP-A-61-236549 on pages 8 to 14, and U.S. Pat. No. 4,783,396.

The compounds of this invention can release industrially useful groups in an imagewise distribution, at high speed and with high efficiency, so they are considered to have many uses. The following instances can be cited as cases to which the above-described function is applicable.

(1) When useful groups in the compounds of this invention are diffusible dyes, dye images can be formed in accordance with a diffusion transfer process using water, a solvent or a mixed solvent, or a thermal diffusion process using heat.

(2) When useful groups in the compounds of this invention are ligands of metal complexes, metal complex images can be formed in accordance with a diffusion transfer process using water, a solvent or a mixed solvent, or a thermal diffusion process. Also, metal complex images can be formed inside the layers wherein the present compounds containing useful groups are incorporated.

(3) When the compounds of this invention are soluble in water, a solvent, or a mixed solvent, but useful groups released therefrom are slightly soluble or insoluble in water, a solvent or a mixed solvent, the present compounds remaining in the unexposed areas are eluted to form images ascribed to the useful groups. Accordingly, these are applicable to imagewise patterns of dye or/and UV absorbent or/and IR absorbent filters, or to light-fast protecting filters.

(4) When photographically useful groups in the compounds of this invention are colorless compounds in the bonded condition or dyes whose absorption wavelengths are shifted by bonding, but they are colored or change their colors by being released, images can be formed by taking advantage of such color changes brought about before and after the release.

(5) When useful groups in the compounds of this invention are fluorine, chlorine, bromine or iodine, they can etch glass or/and silicon dioxide or/and, silicon nitride, or/and silicon monoxide or/and, aluminum, aluminum alloys, iron, iron alloys, silver alloys, and so on in their exposed areas. In this case, microlithography for production of microelectronic devices becomes feasible, and masters for printing plates can be formed.

(6) When useful groups in the compounds of this invention contain sulfur atom(s), they can inactivate metal plating activity toward palladium metal in the areas corresponding to the exposed areas, or can heighten metal plating activity toward nickel metal in the exposed areas. Therefore, they can be applied to printed wiring or metal plating with a pattern.

(7) When useful groups in the compounds of this invention can be mordanting sites to which dyes are to be adsorbed, dyes can be adsorbed to the mordanting sites in the areas corresponding to the exposed areas, resulting in the formation of dye images. In this case, a color microfilter can be formed.

(8) When useful groups in the compounds of this invention are precursors of bases, diazo dyes can be formed through diazo coupling, or polymerization can be initiated by a diazo compound in the exposed areas. Accordingly, color images or polymer images can be formed.

(9) When useful groups in the compounds of this invention can be discolored by a light source installed in a pattern forming apparatus (e.g., g-line) usable in microlithography, contrast enhancement can be achieved in the form of a pattern, whereby fine patterns can be formed in accordance with microlithography.

Specific examples of compounds usable for the above-described purposes are illustrated below. However, the invention should not be construed as being limited to these examples.

Examples of compounds to be preferably used for the foregoing purpose (1) include:

1-1

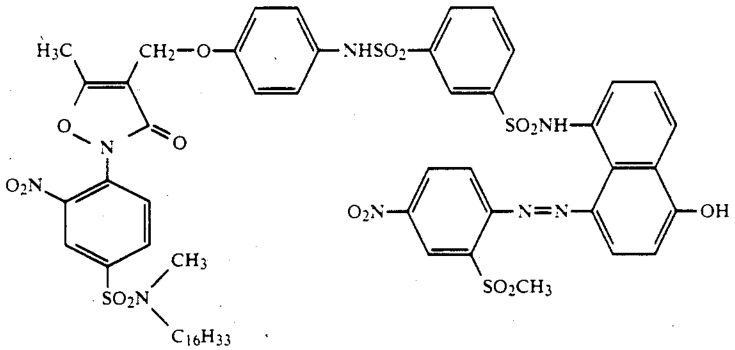

1-2

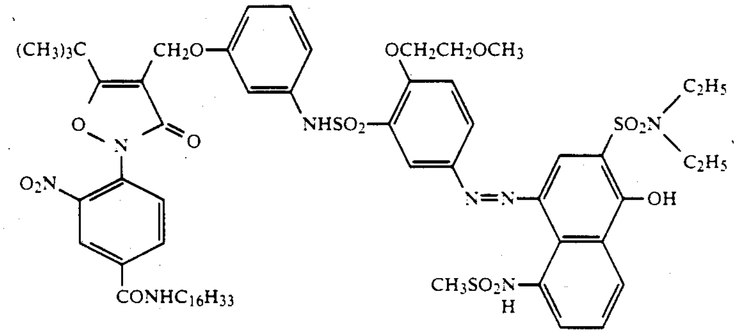

-continued
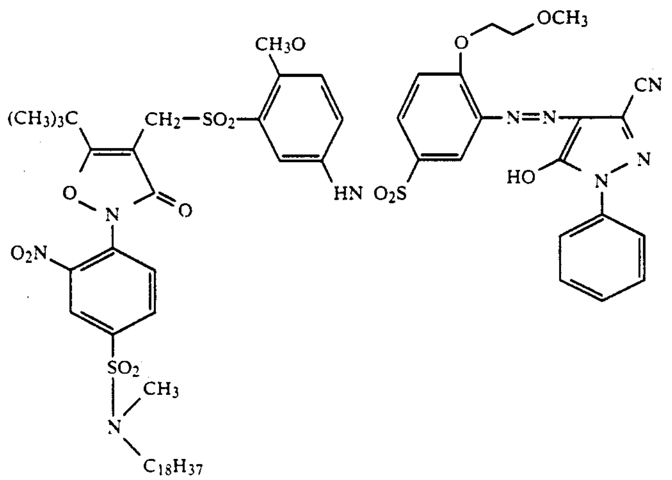
1-3
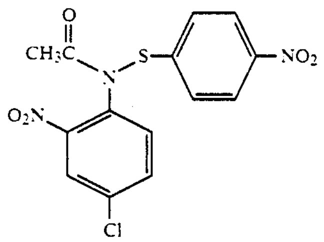
1-4
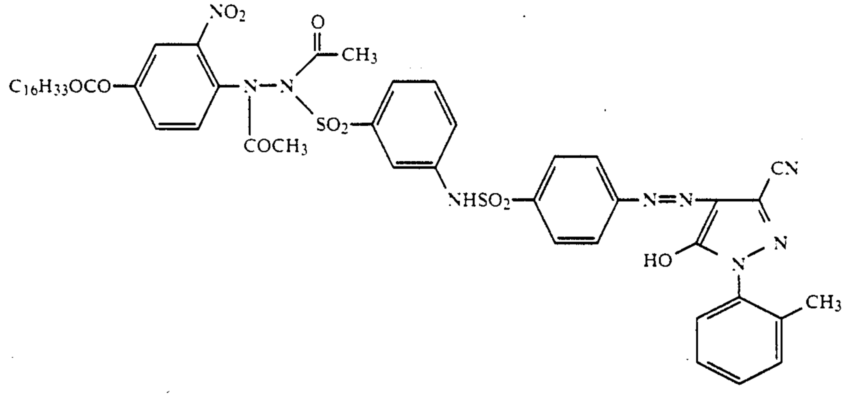
1-5
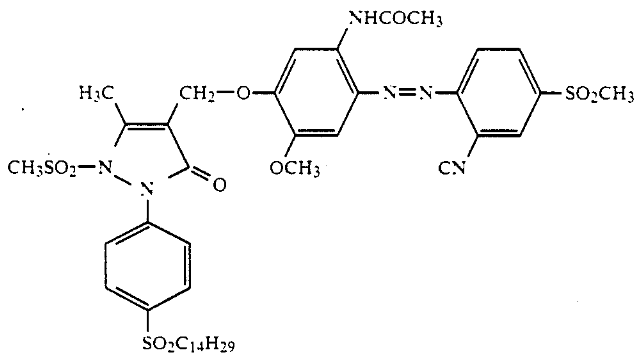
1-6

-continued
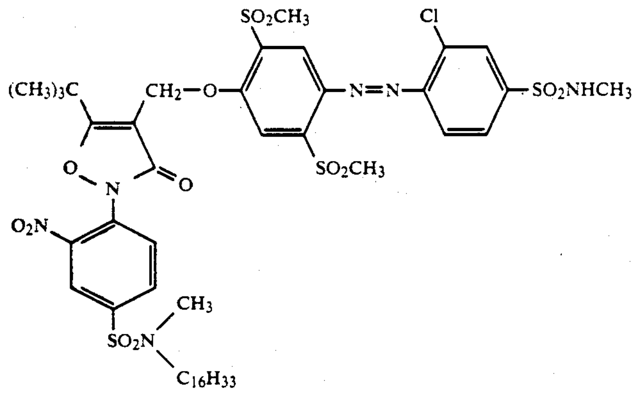
1-7
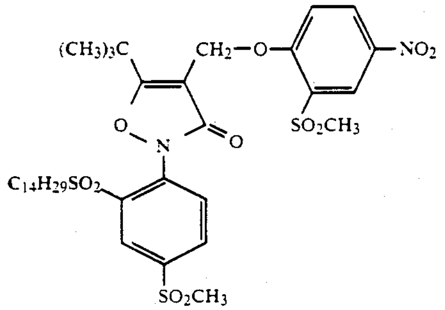
1-8
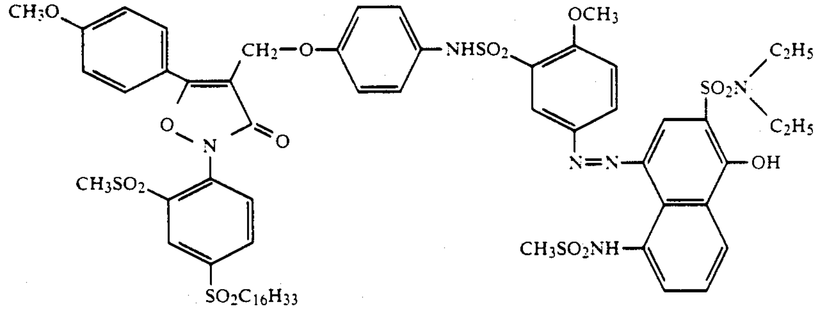
1-9
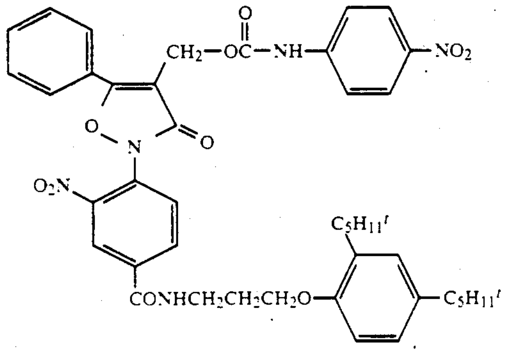
1-10

-continued
1-11
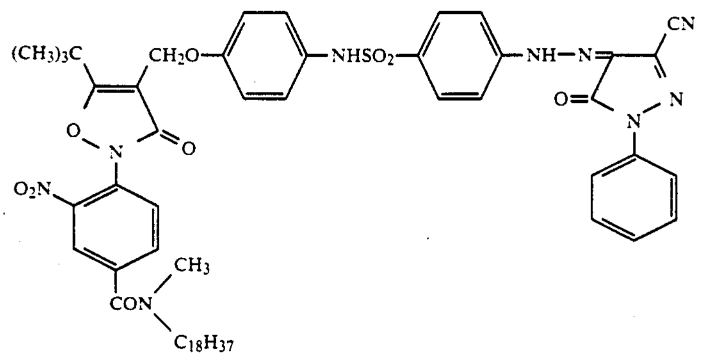
1-12
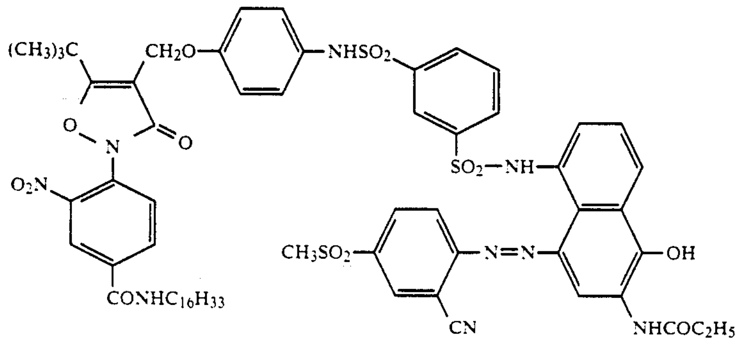
1-13
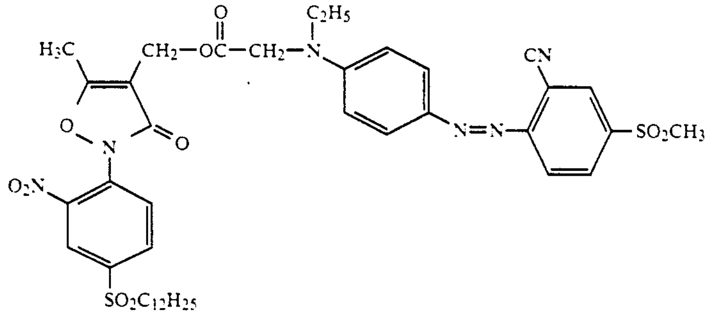
1-14
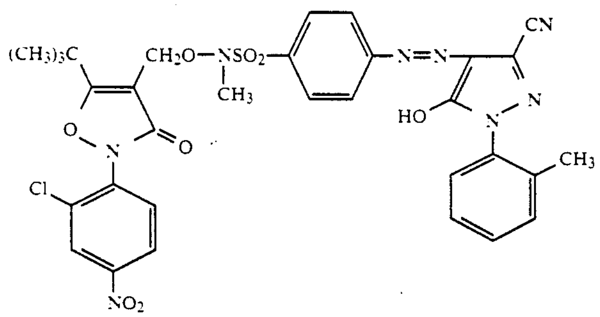
1-15
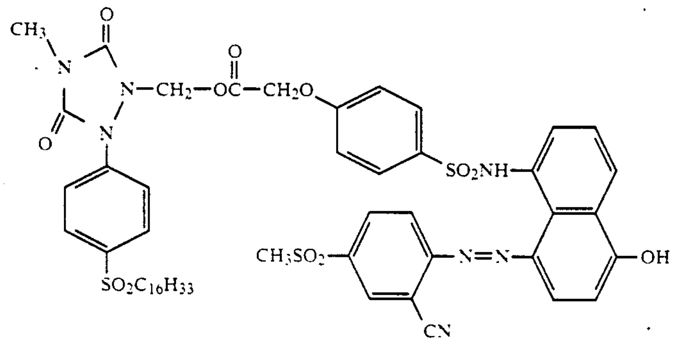

-continued
1-16
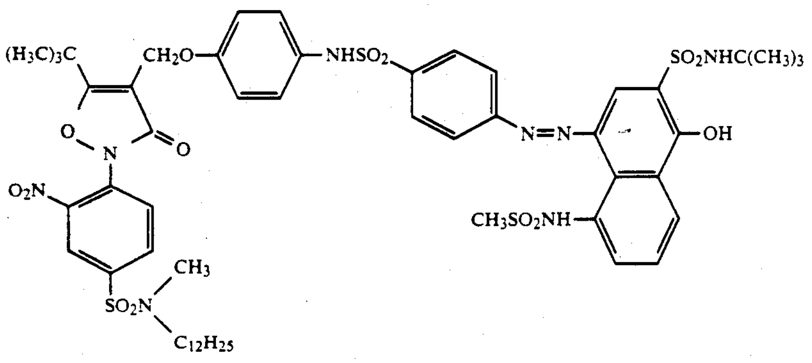
1-17
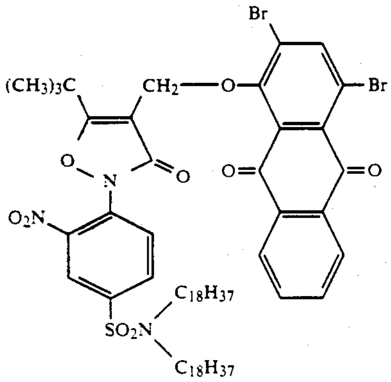
1-18
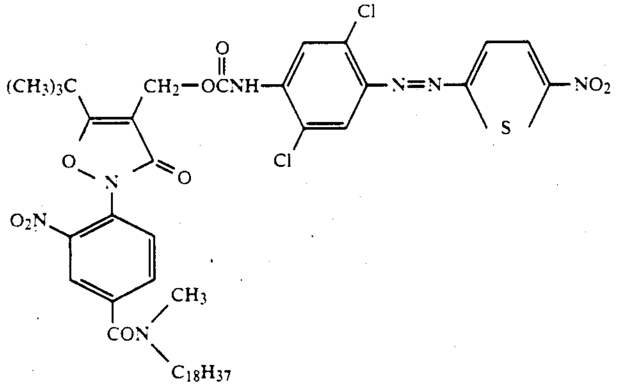
1-19
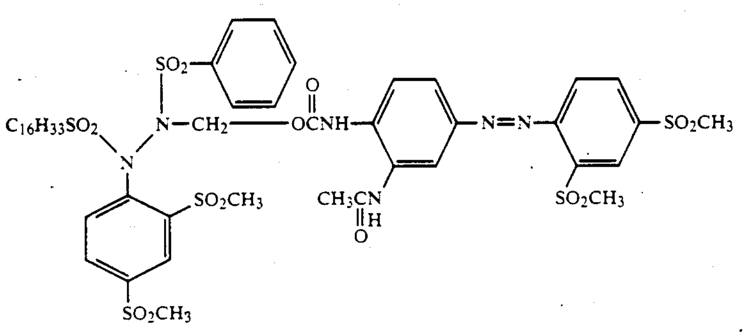

-continued
1-20
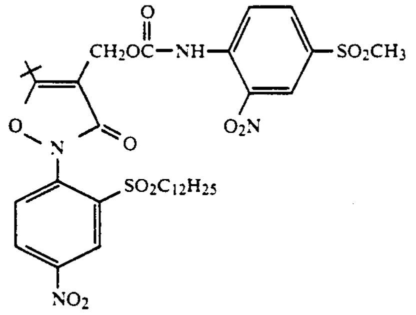
1-21
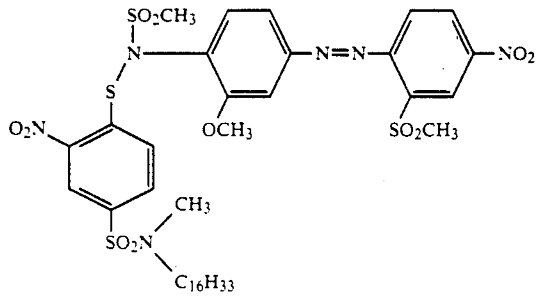
Examples of compounds to be preferably used for the foregoing purpose (2) include:
2-1
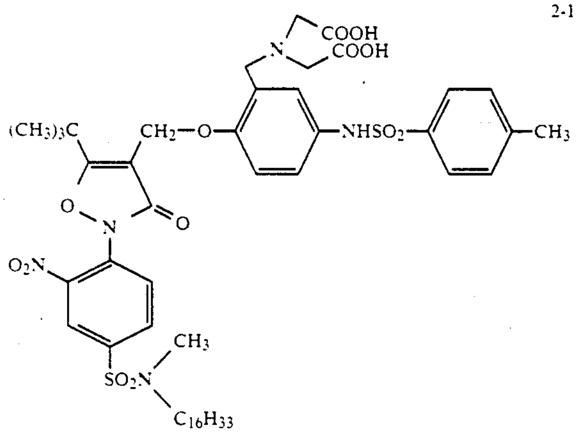
-continued
2-2
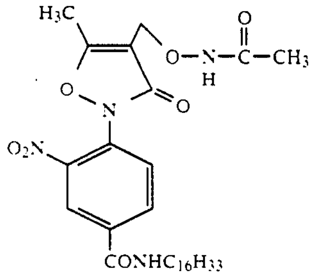
2-3
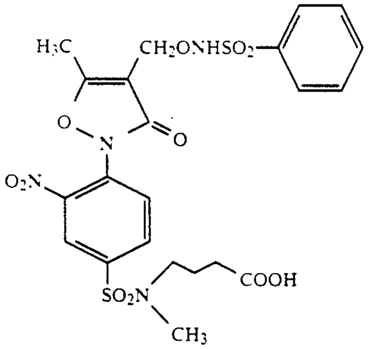
2-4
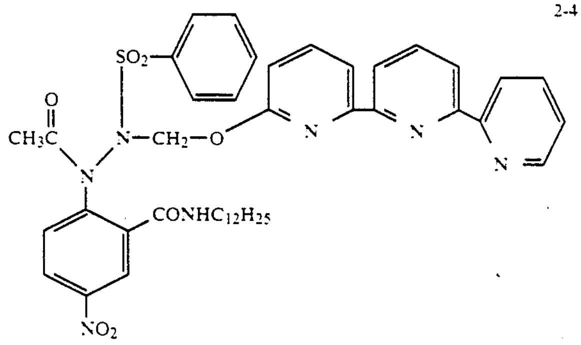

-continued
2-5
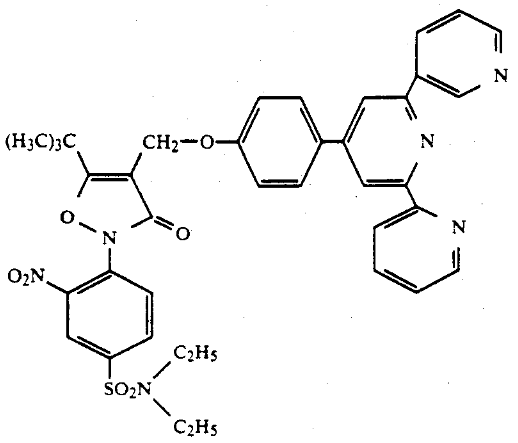
2-6
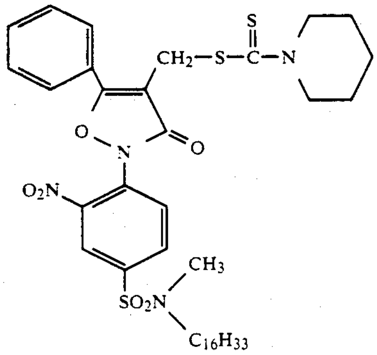
2-7
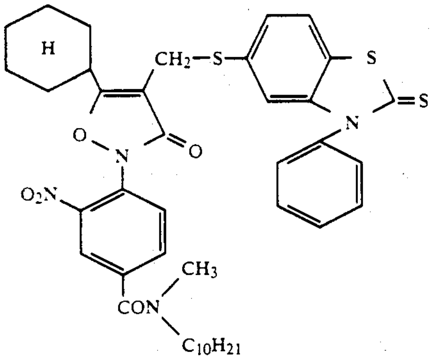
2-8
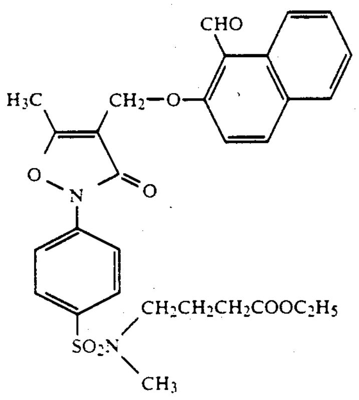
-continued
2-9
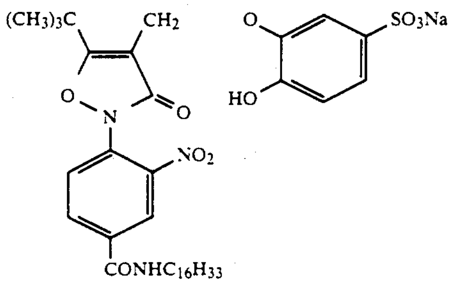
2-10
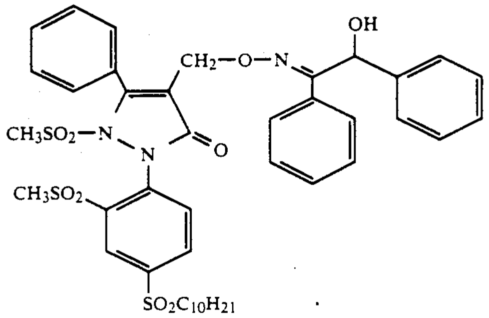
2-11
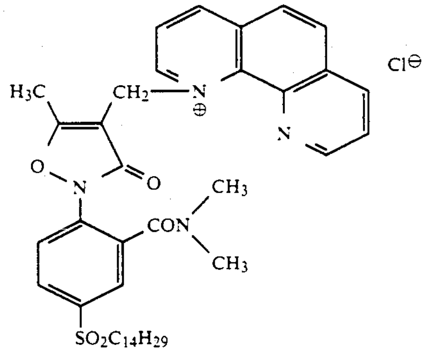
2-12
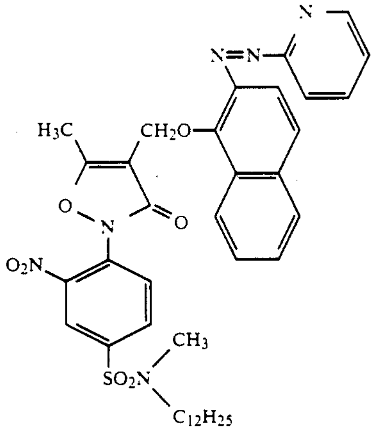

Examples of compounds to be preferably used for the foregoing purpose (3) include:
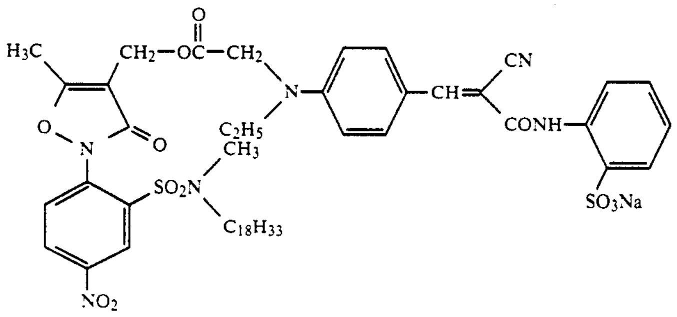
3-1
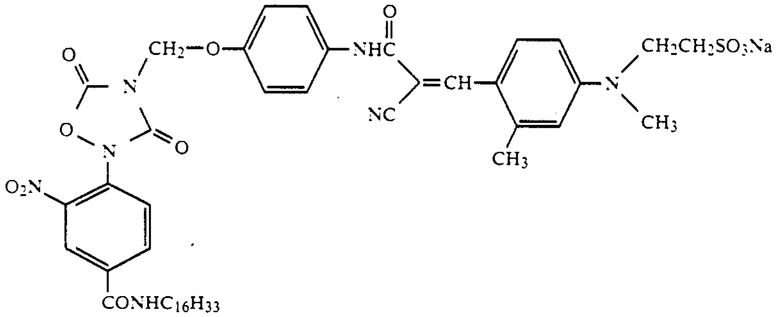
3-2
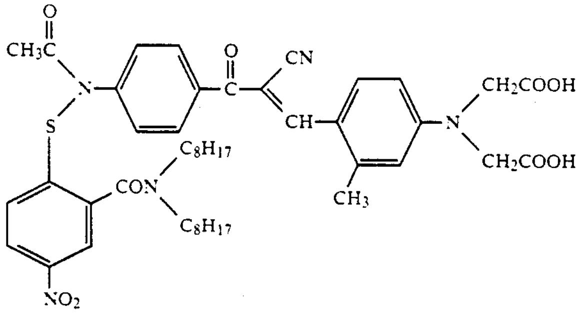
3-3
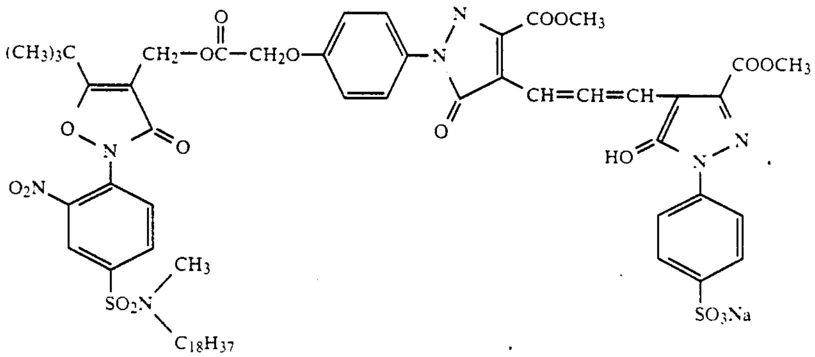
3-4

-continued
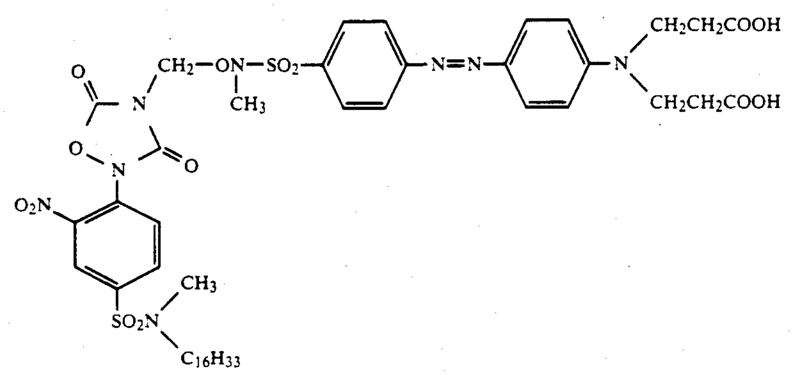
3-5
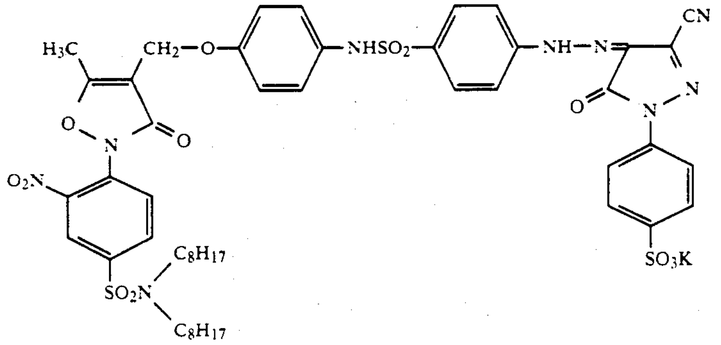
3-6
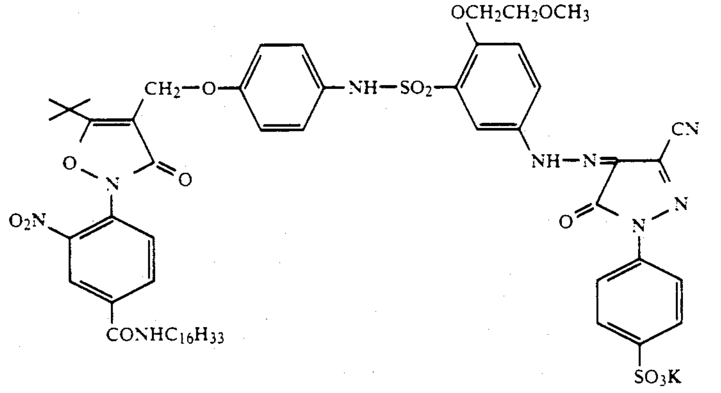
3-7
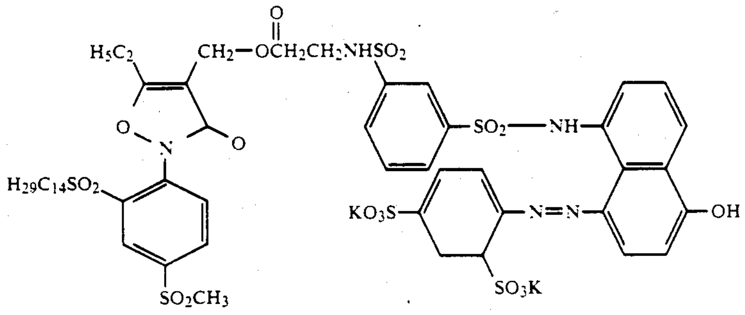
3-8

-continued
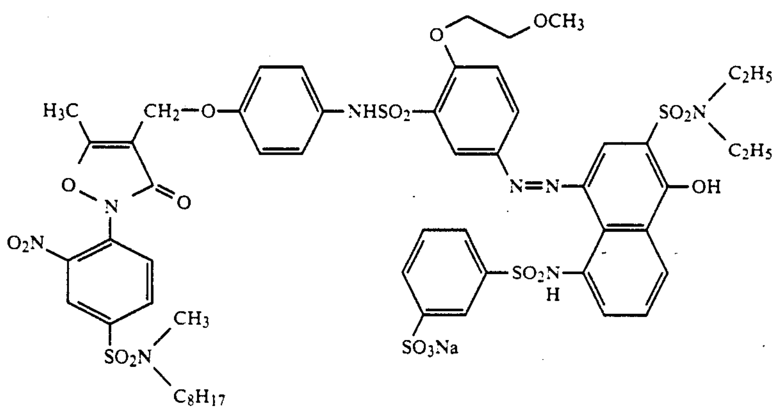
3-9
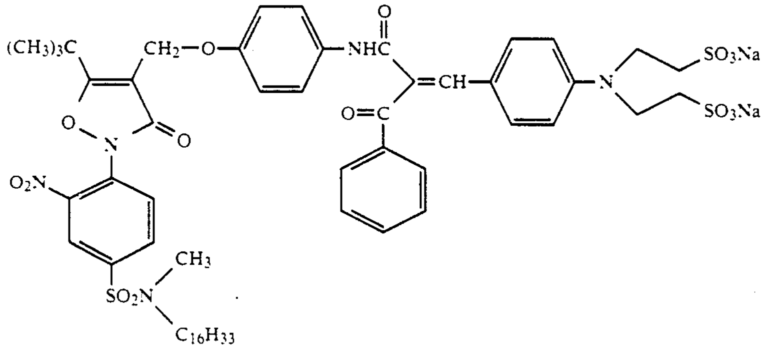
3-10
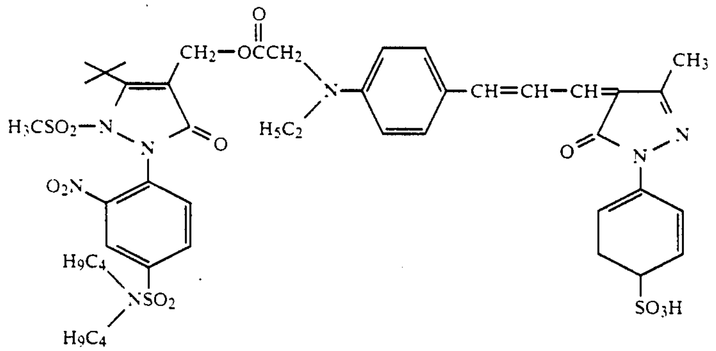
3-11
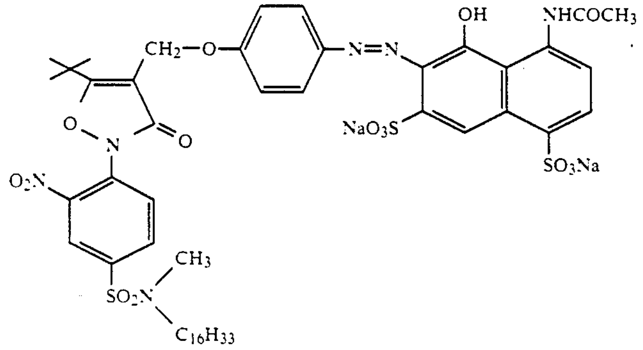
3-12

-continued
3-13
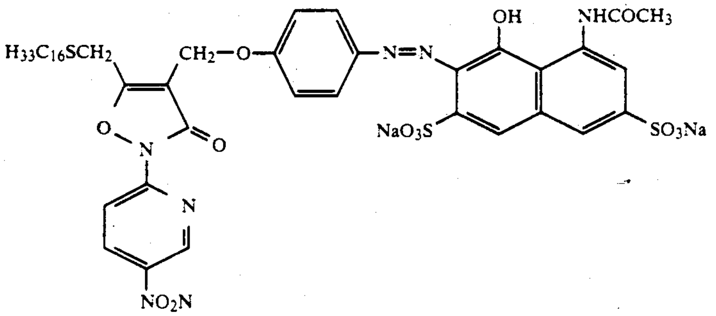
3-14
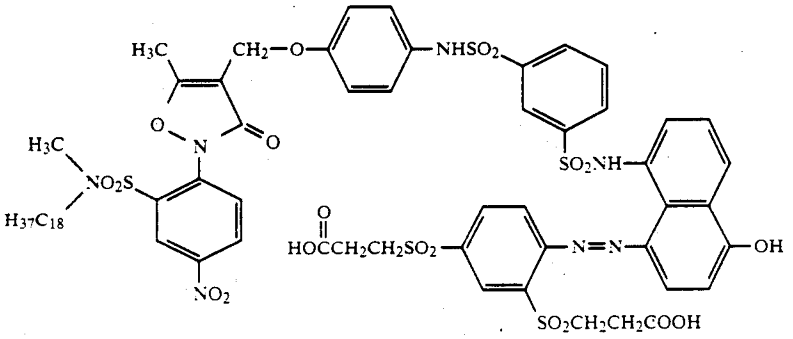
Examples of compounds to be preferably used for the foregoing purpose (4) include:
4-1
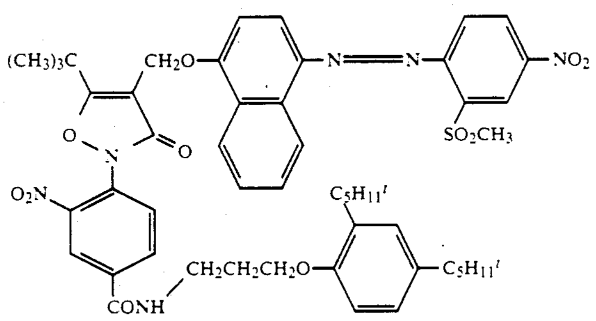
4-2
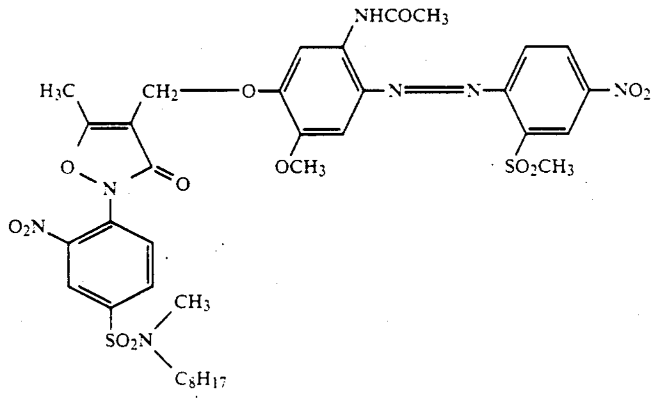

-continued
4-3
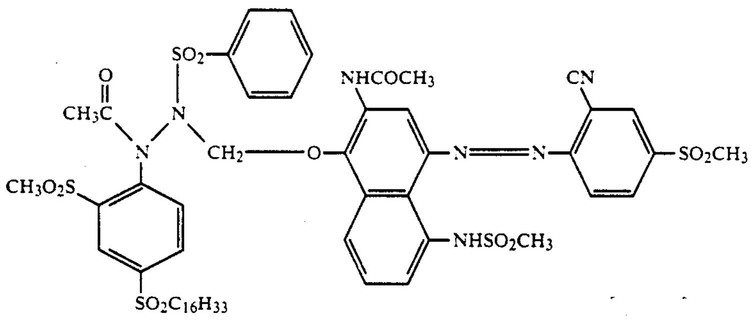
4-4
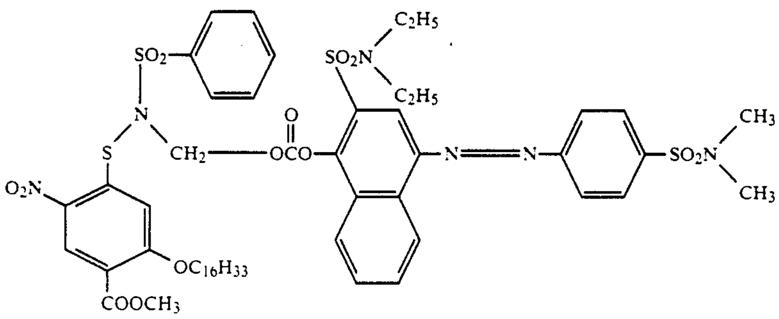
4-5
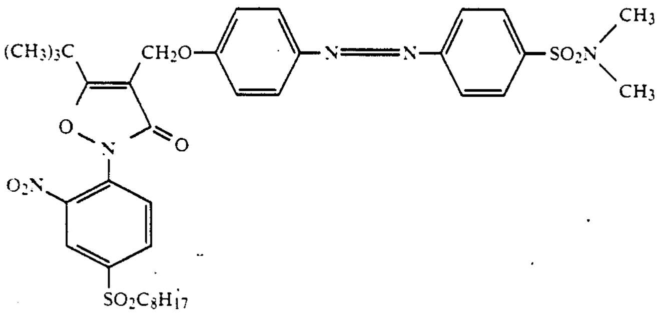
4-6
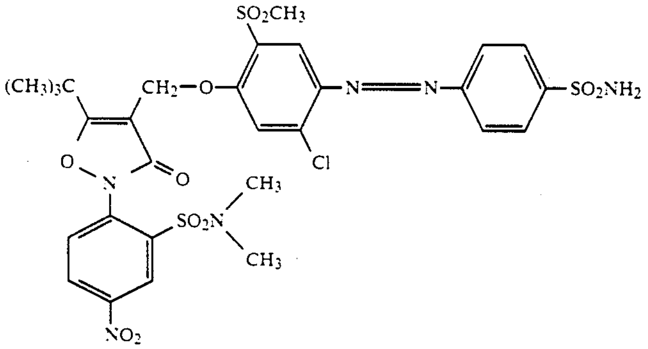
4-7
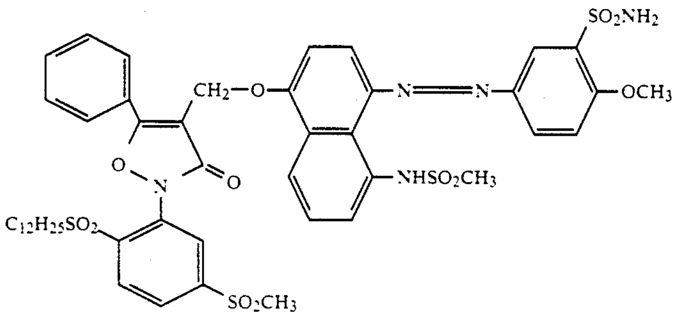

Examples of compounds to be preferably used for the foregoing purpose (5) include:
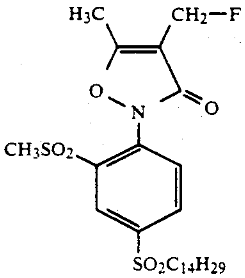
5-1
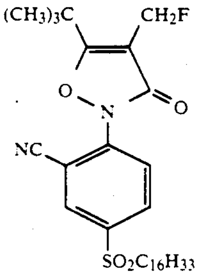
5-2
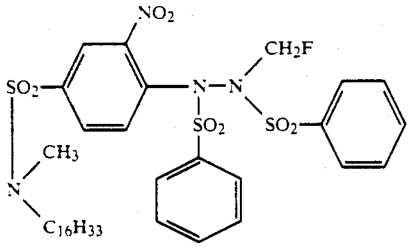
5-3
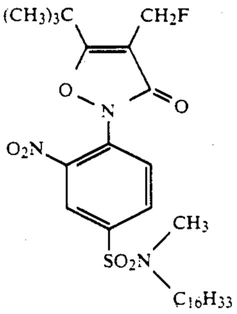
5-4
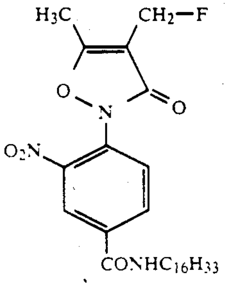
5-5
-continued
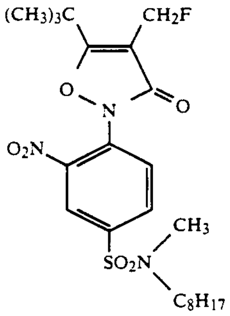
5-6
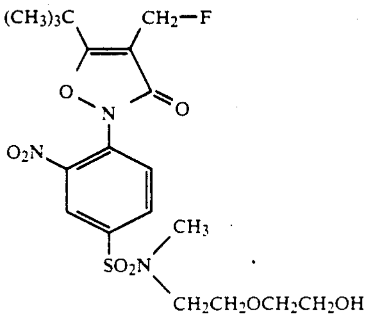
5-7
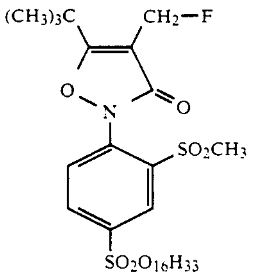
5-8
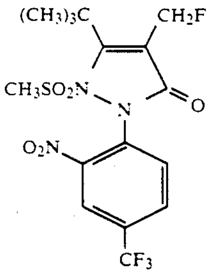
5-9
Examples of compounds to be preferably used for the foregoing purpose (6) include:

-continued
6-1
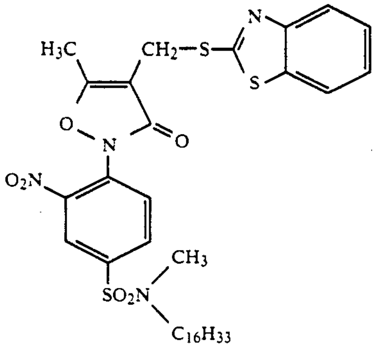
6-2
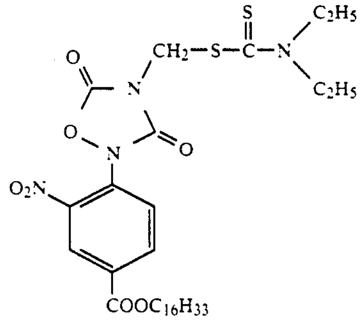
6-3
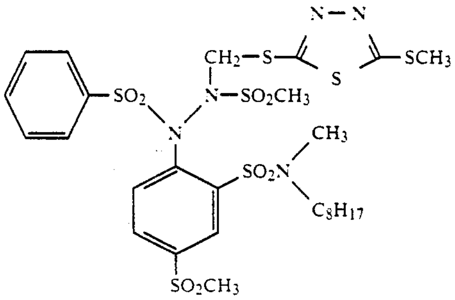
6-4
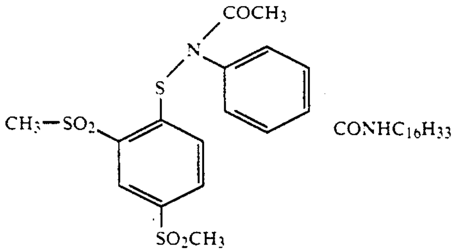
6-5
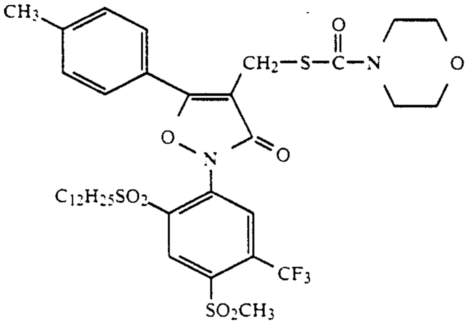
6-6
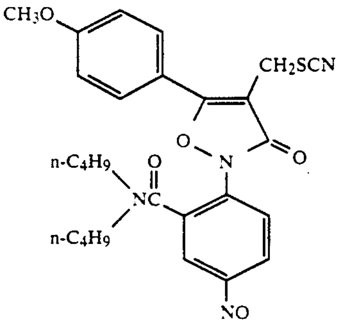
6-7
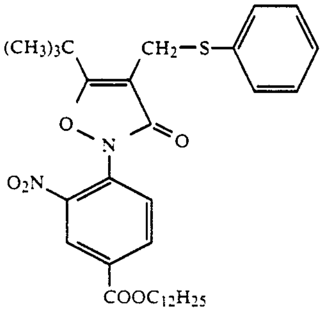
6-8
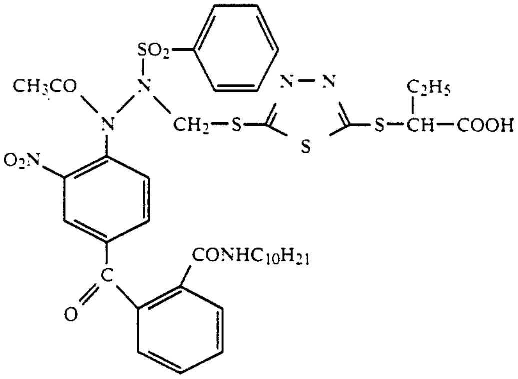
6-9
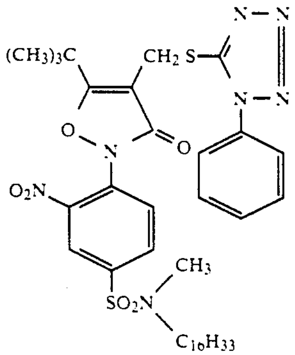
Examples of compounds to be preferably used for the foregoing purpose (7) include:

7-1
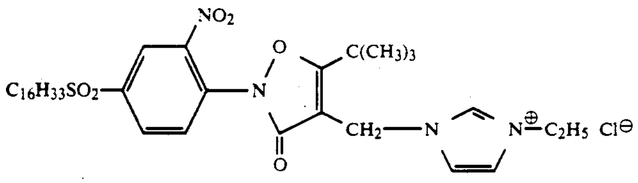
7-2
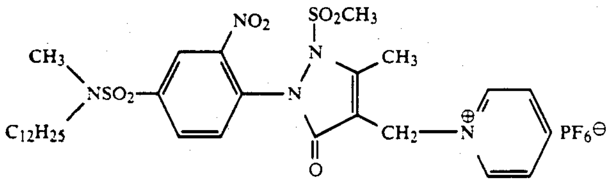
7-3
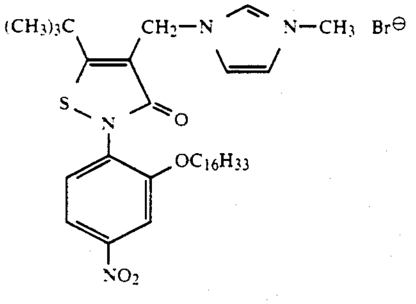
7-4
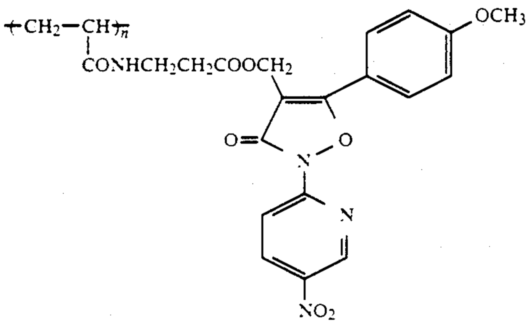
7-5
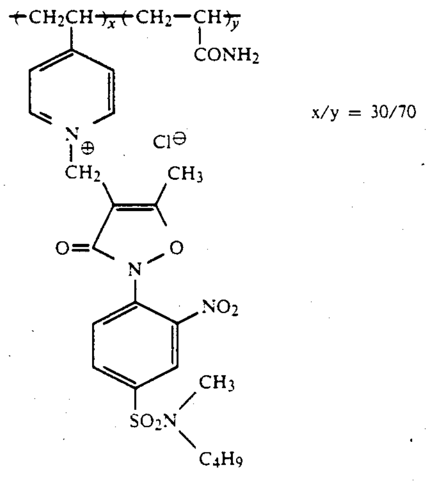

-continued
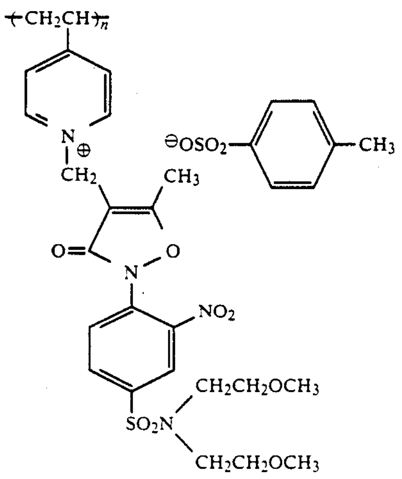
7-6
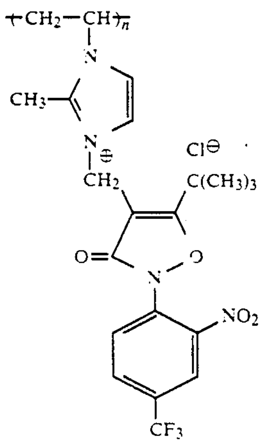
7-7
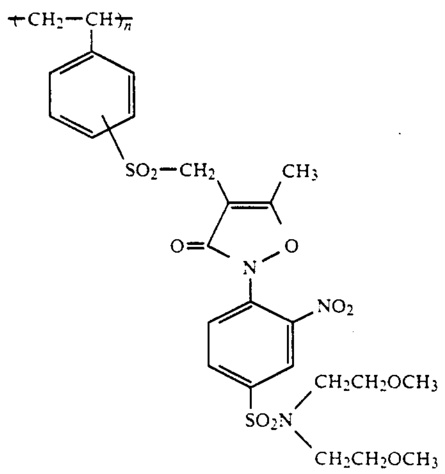
7-8

-continued
7-9
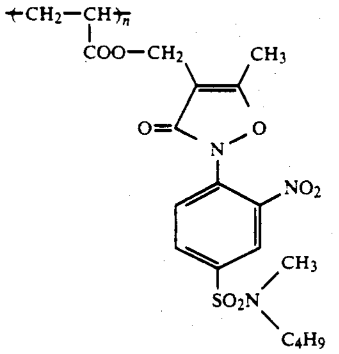
7-10
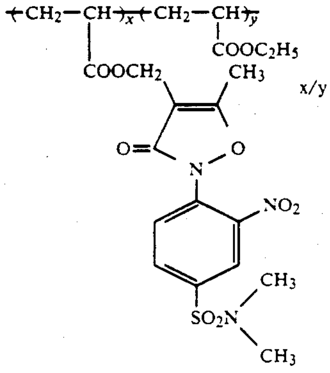
x/y = 50/50
Examples of compounds to be preferably used for the foregoing purpose (8) include:
8-1
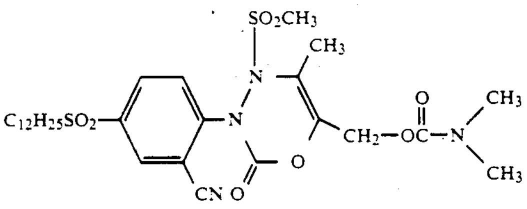
8-2
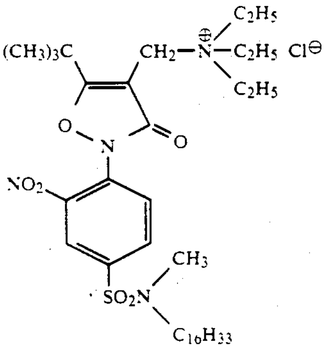
-continued
8-3
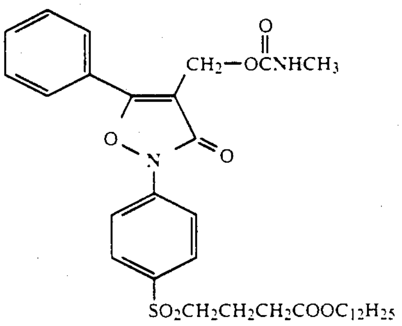
8-4
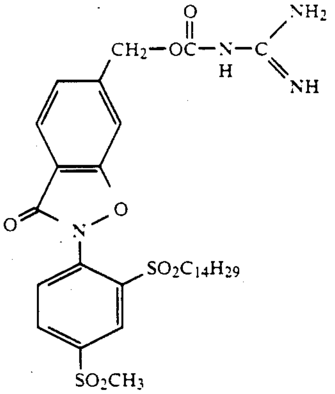

Examples of compounds to be preferably used for the foregoing purpose (9) include:

9-1

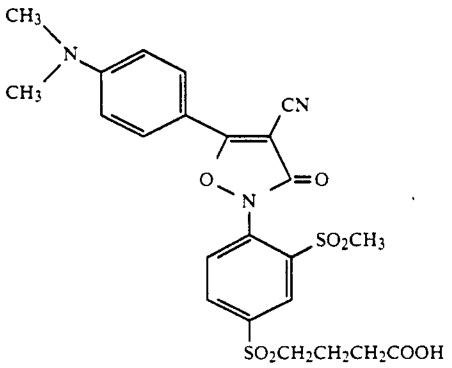

9-2

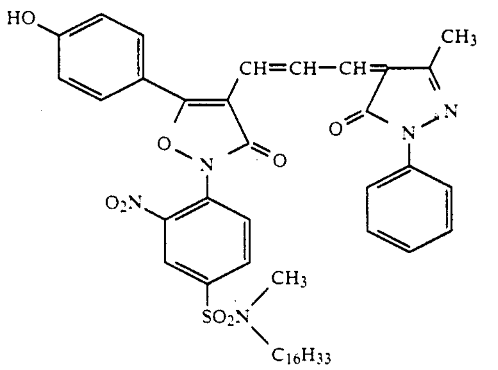

9-3

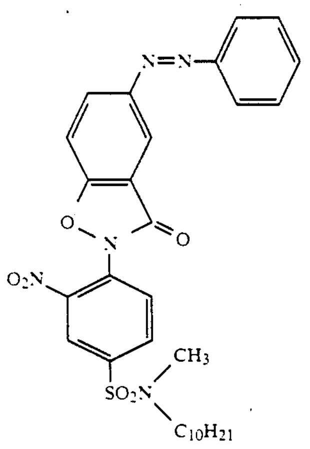

As for the syntheses of the compounds to be used in this invention, that of those having an oxygen atom as X in formula (I) can be effected by reference to the method disclosed in JP-A-62-21527, that of those having a nitrogen-containing group,

as X can be effected by reference to the method described in JP-A-63-201653, and that of those having a sulfur atom as X can be effected by reference to the methods described in JP-A-62-244048 and JP-A-63-201653.

Further, these syntheses are described in detail by the following examples.

SYNTHESIS EXAMPLE 1

Synthesis of Exemplified Compound 3-12

Step 1: Synthesis of 5-t-Butyl-3-hydroxyisooxazole

The compound described above can be synthesized with ease by reference to methods as described in the following literatures and patents: *Sankyo Kenkyusho Nenpoh* (which means "Annual Report of Sankyo Research Institute"), Vol. 22, p. 215 (1970), JP-B-52-9695 (the term "JP-B" as used herein refers to an "examined Japanese patent publication"), *Bulletin de la Societe Chimique de France*, p. 1978, JP-A-57-206668, JP-A-57-206667, *Tetrahedron*, Vol. 20, p. 2835 (1964), JP-A-58-194867, JP-A-57-70878, JP-B-49-48953, JP-A-59-190977, *Journal of Organic Chemistry*, Vol. 48, p. 4307 (1983), *Chemical and Pharmaceutical Bulletin*, Vol. 14, p. 277, *Heterocycles*, Vol. 12, No. 10, p. 1297, *Canadian Journal of Chemistry*, Vol. 62, p. 1940, and JP-A(PCT)-59-501907.

583.7 g of hydroxylamine hydrochloride was dissolved in 2 liters of a 4N aqueous solution of sodium hydroxide, and then cooled in an ice bath. Thereto, 2 liters of ethanol was added, and further a 4N sodium hydroxide/ethanol (1:1) mixed solution was added so as to adjust the pH of the resulting solution to 10.0. Thereto, 1,380 g of ethyl pivaloylacetate and a 1:1 mixture of a 4N aqueous sodium hydroxide solution and ethanol were added dropwise under such a condition that the pH and the temperature of the reaction system might be maintained at 10.0±0.2 and 0° to 5° C., respectively.

After the conclusion of the dropwise addition, the reaction mixture was stirred for 2 hours at room temperature, and then poured into 6 kg of 0° C. concentrated hydrochloric acid. The resulting solution was allowed to stand for 12 hours. The crystals deposited on standing were filtered off, thoroughly washed with water, and then dried. Yield: 770 g, Percent yield: 68.2%, Melting point: 99°-101° C.

Step 2: Synthesis of N-Hexadecyl-3-nitro-4-chlorobenzenesulfonamide 800 g of 3-nitro-4-chlorobenzenesulfonyl chloride and 1,000 ml of dichloromethane were mixed, and thereto was added dropwise a dichloromethane solution containing 600 g of hexadecylamine and 251 ml of triethylamine. After the completion of the reaction, the solvent used was distilled away under reduced pressure, and the residue was dissolved under heating in 3,000 ml of ethanol. Upon gradual cooling, crystals separated out. These crystals were filtered off, and dried. Yield: 1,020 g, Percent yield: 88%, Melting point: 91°-93° C.

Step 3: Synthesis of N-Methyl-N-hexadecyl-3-nitro-4-chlorobenzenesulfonamide 170 g of N-hexadecyl-3-nitro-4-chlorobenzenesulfonamide was dissolved in 640 ml of acetone, and thereto were added 79 g of potassium carbonate, 6 ml of Polyethylene Glycol 400 and 71 g of dimethyl sulfate. The resulting mixture was heated under reflux for 5 hours. To the resulting reaction mixture, 240 ml of acetone was added, and then 870 ml of water was added dropwise. Upon cooling to room temperature, crystals were deposited. The crystals were filtered off, washed successively with water and methanol, and then dried. Yield: 169 g, Percent yield: 97%, Melting point: 74°-75° C.

Step 4: Synthesis of 5-t-Butyl-2-(4-N-methyl-N-hexadecylsulfamoyl-2-nitrophenyl)-4-isooxazolin-3-one 470 g of N-methyl-N-hexadecyl-3-nitro-4-chlorobenzenesulfonamide, 169 g of 5-t-butyl-3-hydroxyisooxazole, 168 g of potassium carbonate, and 1.2 liters of dimethyl sulfoxide were mixed, and underwent reaction for 6 hours at 65° C. The reaction mixture was poured into ice-cold water to precipitate crystals. These crystals were filtered off, washed with water and then dried. Yield: 576 g, Percent yield: 100 g, Melting point: 67-°68° C.

Step 5: Synthesis of 5-t-Butyl-4-chloromethyl-2-(4-N-methyl-N-hexadecylsulfamoyl-2-nitrophenyl)-4-isooxazolin-3-one 550 g of 5-t-butyl-2-(4-N-methyl-N-hexadecylsulfamoyl-2-nitrophenyl)-4-isooxazolin-3-one, 200 g of zinc chloride, 200 g of paraformaldehyde, and 1.5 liters of acetic acid were mixed, and heated under reflux for 10 hours as hydrogen chloride gas was bubbled into the reaction system. After cooling, the reaction mixture was poured into water, and the thus precipitated crystals were filtered off, and recrystallized from an acetonitrile/methanol (1:4) mixed solvent. Yield: 585 g, Percent yield: 96%, Melting point: 56° C.

Step 6: Synthesis of 5-t-Butyl-4-(4-acetylaminophenoxymethyl)-2-(4-N-methyl-N-hexadecylsulfamoyl-2-nitrophenyl)-4-isooxazolin-3-one 50 g of 5-t-butyl-4-chloromethyl--2-(4-N-methyl-N-hexadecylsulfamoyl-2-nitrophenyl)-4-isooxazolin-3-one, 12.6 g of 4-acetylaminophenol, 13.4 g of potassium carbonate, 200 ml of acetone and 1.0 g of sodium iodide were mixed, and heated under reflux for 6 hours. After cooling, the reaction mixture was poured into water, and extracted with ethyl acetate. The organic phase was dried over anhydrous sodium sulfate, and then the solvent was distilled away under reduced pressure. Methanol was added to the residue, and allowed to stand overnight. The thus precipitated crystals were filtered off. Yield: 47.8 g, Percent yield: 80.8%.

Step 7: Synthesis of 5-t-Butyl-4-(4-aminophenoxymethyl)-2-(4-N-methyl-N-hexadecylsulfamoyl-2-nitrophenyl)-4-isooxazolin-3-one 45 g of 5-t-butyl-4-(4-acetylaminophenoxymethyl)-2-(4-N-methyl-N-hexadecylsulfamoyl-2-nitrophenyl)-4-isooxazolin-3-one, which was prepared in the foregoing Step 6, and 250 ml of ethanol were mixed, and thereto were added 125 ml of water and 25 ml of concentrated sulfuric acid. The resulting mixture was heated under reflux for 5 hours. After the completion of the reaction, the reaction mixture was cooled to precipitate crystals. These crystals were filtered off, washed with ethanol, and dried. From the elemental analysis, it turned out that ½ mol of sulfuric acid was contained in the crystal composition. Yield: 44.1 g, Melting point: 250° C. or higher.

Step 8: Synthesis of Exemplified Compound 3-12

60 g of 5-t-butyl-4-(4-aminophenoxymethyl)-2-(4-N-methyl-N-hexadecylsulfamoyl-2-nitrophenyl)-4-isooxazolin-3-one sulfate was dissolved in 200 ml of dimethylacetamide, and thereto was added 15 ml of concentrated hydrochloric acid at room temperature, followed by cooling in an ice bath. Thereto, 50 ml of an aqueous solution containing 9 g of sodium sulfite was added dropwise as the temperature of the reaction system was maintained at 10° C. or lower. In a little while after dropwise addition, the diazonium salt separated out in a slurry condition.

Separately, a solution was prepared by dissolving 30 g of acetyl-H-acid in 500 ml of dimethylacetamide, and thereto adding 30 ml of pyridine, and controlled to a temperature of 0° C. To the thus prepared solution, the above-described diazonium salt was slowly added as the reaction system was cooled in an ice bath. Thereupon, the solution turned red in a moment. After the conclusion of the addition, the reaction mixture was vigorously stirred for 30 minutes at room temperature, and then poured into diluted hydrochloric acid. The thus deposited crystals were filtered off, washed with ethanol, and purified many times by column chromatography on silica gel to obtain the intended compound. Yield: 22 g, Percent yield: 25%, Melting point: 260° C. or higher.

SYNTHESIS EXAMPLE 2

Synthesis of Exemplified Compound 6-9

In 500 ml of acetone were dissolved 250 g of 5-t-butyl-4-chloromethyl-2-(4-N-methyl-N-hexadecylsulfamoyl-2-nitrophenyl)-4-isooxazolin-3-one and 75 g of 1-phenyl-5-mercaptotetrazole, and thereto was added 60 g of potassium carbonate. The resulting mixture was stirred for 2 hours at room temperature. Then, the reaction mixture was poured into diluted hydrochloric acid, and extracted with ethyl acetate. The extract obtained was washed with water, dried, and then concentrated under reduced pressure. The resulting residue was recrystallized from a mixture of 1 liter of ethanol and 0.1 liter of ethyl acetate. Yield: 250 g, Percent yield: 82%, Melting point: 73°-75° C.

SYNTHESIS EXAMPLE 3

Synthesis of Exemplified Compound 1-11

Step 1: Synthesis of N-Methyl-N-octadecyl-3-nitro-4-chlorobenzamide 102.7 g of 3-nitro-4-chlorobenzoic acid was mixed with 800 ml of acetonitrile, and thereto was added 68.6 g of thionyl chloride. The resulting mixture was heated under reflux for 4 hours, and thereto was added 63.5 g of triethylamine. After controlling the temperature of the reaction system to 5° C., a chloroform solution containing 148.6 g of methyloctadecylamine was further added dropwise. After the completion of the reaction, the reaction mixture was dispersed into water, and the organic phase was dried over anhydrous sodium sulfate. The inorganic matter was filtered out, and the solvent was distilled away. The reaction product was recrystallized from a 1:3 mixture of acetonitrile and methanol. Yield: 186 g, Percent yield: 76.0%, Melting point: 55°-56° C.

Step 2: Synthesis of 5-t-Butyl-2-(4-N-methyl-N-octadecylcarbamoyl-2-nitrophenyl)-3-isooxazolone 300 ml of dimethylformamide was admixed with 34.1 g of N-methyl-N-octadecyl-3-nitro-4-chlorobenzamide, 12.4 g of 5-t-butyl-3-hydroxyisooxazole and 12.4 g of potassium carbonate, and the resulting mixture was heated at 100° C. for 5 hours to undergo the reaction. The solvent was distilled away under reduced pressure, and to the residue were added ethyl acetate and water. After stirring, the organic phase was taken out, and the main product was separated therefrom by column chromatography on silica gel, followed by recrystallization from a mixture of n-hexane and ethyl acetate. Yield: 18.0 g, Percent yield: 43.1%, Melting point: 64° C.

Step 3: Synthesis of 4-Chloromethyl-5-t-butyl-2-(4-N-methyl-N-octadecylcarbamoyl-2-nitrophenyl)-3-isooxazolone 36 g of 5-t-butyl-2-(4-N-methyl-N-octadecylcarbamoyl-2-nitrophenyl)-3-isooxazolone, 5.7 g of paraformaldehyde, and 10.3 g of zinc chloride were mixed with 250 ml of acetic acid, and underwent the reaction at 100° C. for 20 hours as hydrogen chloride gas was bubbled thereinto. After the completion of the reaction, the reaction mixture was cooled, and poured into ice-cold water. The thus deposited solid was filtered off, dissolved in chloroform, and then purified by column chromatography. Yield: 10.0 g, Percent yield: 25.6%, Melting Point: 77° C.

Step 4: Synthesis of 4-(4-t-Butoxycarbonylaminophenoxymethyl)-5-t-butyl-2-(4-N-methyl-N-octadecylcarbamoyl-2-nitrophenyl)-3-isooxazolone 10.0 g of 4-chloromethyl-5-t-butyl-2-(4-N-methyl-N-octadecylcarbamoyl-2-nitrophenyl)-3-isooxazolone, 4.0 g of 4-t-butoxycarbonylaminophenol and 3.0 g of potassium carbonate were mixed with 100 ml of acetone, and heated under reflux for 7 hours. After the completion of the reaction, the acetone was distilled away, and the reaction product was extracted with a mixture of ethyl acetate and water. The organic phase was purified by column chromatography on silica gel. Yield: 9.0 g, Percent yield: 70.5%.

Step 5: Synthesis of 4-(4-t-Aminophenoxymethyl)-5-t-butyl-2-(4-N-methyl-N-octadecylcarbamoyl-2-nitrophenyl)-3-isooxazolone 5.4 g of 4-(4-t-butoxycarbonylaminophenoxymethyl)-5-t-butyl-2-(4-N-methyl-N-octadecylcarbamoyl-2-nitrophenyl)-3-isooxazolone was dissolved in 40 ml of chloroform, and cooled to 5° C. Thereto, 10 ml of trifluoroacetic acid was slowly added dropwise. The temperature of the reaction system was gradually raised to room temperature, and the reaction was made to continue for 10 hours. After the completion of the reaction, the reaction mixture was poured into an aqueous solution of sodium bicarbonate, and extracted with ethyl acetate. The extract was purified by flash column chromatography on silica gel. Yield: 6.9 g, Percent yield: 90.8%.

Step 6: Synthesis of Exemplified Compound 1-11

5.4 g of 4-(4-t-aminophenoxymethyl)-5-t-butyl-2-(4-N-methyl-N-octadecylcarbamoyl-2-nitrophenyl)-3-isooxazolone was dissolved in 40 ml of chloroform, and cooled to 0° C. Thereto were added 0.8 g of pyridine, and then 3.1 g of Compound (a) illustrated below. The resulting mixture underwent the reaction for 2 hours. After the completion of the reaction, the chloroform was distilled away, and the residue was dissolved in a small quantity of dimethylformamide. Then, methanol was added thereto in such an amount that an oily matter might not separate out, and stirred. Thus, crystals were deposited. These crystals were filtered off, and purified many times in the same manner as described above in Synthesis Example 1, Step 9. Yield: 3.9 g, Percent yield: 46.5%, Melting point: 157°-159° C.

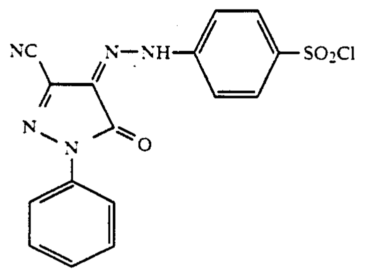

Compound (a)

SYNTHESIS EXAMPLE 4

Synthesis of Exemplified Compound 1-12

Step 1: Synthesis of Ethyl 4-Chloro-3-nitrobenzoate 6 g of 4-chloro-3-nitrobenzoic acid was mixed with 17 ml of methanol, and stirred at room temperature. Thereto was added 0.6 ml of concentrated sulfuric acid, and then the resulting mixture was heated under reflux for 4 hours. After the completion of the reaction, the reaction system was cooled, and thereto was added 17 ml of water. The thus deposited crystals were filtered off. Yield: 6.0 g, Percent yield: 93.5%.

Step 2: Synthesis of 5-t-Butyl-2-(4-ethoxycarbonyl-2-nitrophenyl)-4-isooxazolin-3-one 413.3 g of ethyl 4-chloro-3-nitrobenzoate, 305 g of 5-t-butyl-3-hydroxyisooxazole and 1 liter of dimethyl sulfoxide were mixed, and stirred. Thereto was added 300 g of sodium bicarbonate, and the reaction was run at 90° C. for 8 hours. Thereafter, the reaction mixture was cooled, and thereto were added 1.5 liters of methanol, and further 3 liters of water to precipitate crystals. These crystals were filtered off. Yield: 560.7 g, Percent yield: 93.2%.

Step 3: Synthesis of 5-t-Butyl-4-chloromethyl-2-(4-carboxy-2-nitrophenyl)-4-isooxazolin-3-one 300.9 g of 5-t-butyl-2-(4-ethoxycarbonyl-2-nitrophenyl)-4-isooxazolin-3-one, 191.1 g of paraformaldehyde, 191.1 g of zinc chloride and 910 ml of acetic acid were mixed, and underwent the reaction over a steam bath for 4 hours as hydrogen chloride gas was bubbled thereto. Then, 500 ml of water was added thereto, and the reaction was further run for 2 hours. Moreover, 500 ml of concentrated hydrochloric acid was added thereto, and heated for an additional 3 hours. Thereafter, the heating was stopped, and the reaction mixture was cooled to room temperature. The thus deposited crystals were filtered off, washed with water, and dried. Yield: 319.3 g, Percent yield: 96%.

Step 4: Synthesis of 5-t-Butyl-4-chloromethyl-2-(4-n-hexadecylcarbamoyl-2-nitrophenyl)-4-isooxazolin-3-one 81.6 g of 5-t-butyl-4-chloromethyl-2-(4-carboxy-2-nitrophenyl)-4-isooxazolin-3-one was mixed with 480 ml of ethyl acetate, and cooled to −15° C. To the thus obtained suspension, 32.6 ml of triethylamine was added dropwise, and then 22.0 ml of ethylchlorocarbanate was further added dropwise as the reaction mixture was kept at −10° C. After running the reaction for 50 minutes, 49 g of hexadecylamine was added to the reaction mixture to further undergo the reaction for 10 minutes at −10° C. The temperature of the reaction system was gradually raised up to room temperature. The resulting reaction mixture was allowed to stand overnight, and then 400 ml of water was added thereto to separate into two phases. The organic phase was taken out, and concentrated to dryness. The residue was crystallized from methanol. Yield: 100.9 g, Percent yield: 75.9%.

Step 5: Synthesis of 5-t-Butyl-4-(4-aminophenoxymethyl)-2-(4-n-hexadecylcarbamoyl-2-nitrophenyl)-4-isooxazolin-3-one 5.8 g of 5-t-butyl-4-chloromethyl-2-(4-n-hexadecylcarbamoyl-2-nitrophenyl)-4-isooxazolin-3-one and 1.4 g of potassium carbonate were mixed with 40 ml of acetone, and thereto were added 0.4 g of sodium iodide and 0.4 ml of polyethylene glycol. Thereto, 1.7 g of 4-acetylaminophenol was further added, and the resulting mixture was heated under reflux for 5 hours. After the completion of the reaction, crystals were precipitated by addition of diluted hydrochloric acid, and then filtered off. To the crystals taken out were added 40 ml of ethanol and 20 ml of concentrated hydrochloric acid, and the mixture was heated under reflux for 4 hours. After cooling, crystals separated out on stirring. They were filtered off, and washed successively with acetonitrile and acetone. Yield: 5.5 g, Percent yield: 79.4%, Melting point: 220° C. or higher.

Step 6: Synthesis of Exemplified Compound 1-12

150 g of 5-t-butyl-4-(4-aminophenoxymethyl)-2-(4-n-hexadecylcarbamoyl-2-nitrophenyl)-4-isooxazolin-3-one hydrochloride, 750 ml of dimethylacetamide, and 144.8 g of Compound (b) illustrated below were mixed. To the mixture kept at 20° C. or lower, 51 ml of pyridine was added dropwise, and stirred for 2 hours at room temperature. Thereafter, 1,500 ml of methanol was added to the reaction mixture, and then 100 ml of water was slowly added dropwise with stirring to result in deposition of crystals. These crystals were filtered off, washed with methanol, and dried to obtain the intended compound. Yield: 198 g, Percent yield: 70.2%, Melting point: 180°-183° C.

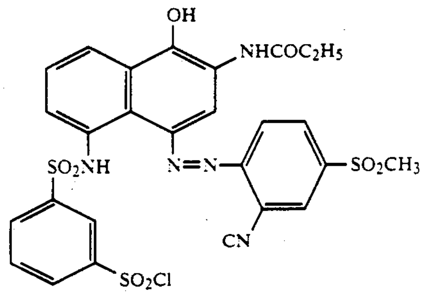

Compound (b)

SYNTHESIS EXAMPLE 5

Synthesis of Exemplified Compound 3-1

Step 1: Synthesis of N-Methyl-N-octadecyl-3-nitro-4-chlorobenzenesulfonamide

In 300 ml of chloroform, 100 g of 4-chloro-3-nitrobenzenesulfonyl chloride was dissolved, and cooled to 0° C. Thereto, a solution of 84.3 g of methyloctadecylamine in chloroform was added dropwise. Then, 39.5 g of triethylamine was added dropwise as the reaction system was kept at a temperature from 0° C. to 10° C. After the conclusion of the addition, the reaction was run for 1 hour. Then, the solvent was distilled away, and the residue was dissolved in 500 ml of methanol under heating. The solution was allowed to stand for a while in order to cool. Thereupon, crystals separated out, and they were filtered off. Yield: 109 g, Percent yield: 71.2%, Melting point: 86°-87° C.

Step 2: Synthesis of 5-t-Butyl-2-(4-N-methyl-N-octadecylsulfamoyl-2-nitrophenyl)-4-isooxazolin-3-one 600 g of N-methyl-N-octadecyl-3-nitro-4-chlorobenzenesulfonamide, 202 g of 5-t-butyl-3-hydroxyisooxazole, 200 g of potassium carbonate and 1.8 liters of dimethyl sulfoxide were mixed, and underwent the reaction at 65° C. for 6 hours. The reaction mixture was poured into ice-cold water to precipitate crystals. The crystals were filtered off, washed with water, and dried. Yield: 709 g, Percent yield: 98%, Melting point: 68°-69° C.

Step 3: Synthesis of 5-t-Butyl-4-chloromethyl-2-(4-N-methyl-N-octadecylsulfamoyl-2-nitrophenyl)-4-isooxazolin-3-one 650 g of 5-t-butyl-2-(4-N-methyl-N-octadecylsulfamoyl-2-nitrophenyl)-4-isooxazolin-3-one, 200 g of zinc chloride, 200 g of paraformaldehyde and 3.0 liters of acetic acid were mixed, and heated under reflux for 10 hours as hydrogen chloride gas was bubbled thereinto. After cooling, the reaction mixture was poured into water to precipitate crystals. The crystals were filtered off, and recrystallized from a 1:4 mixed solvent of acetonitrile and methanol. Yield: 579 g, Percent yield: 82.4%, Melting point: 55°-56° C.

Step 4: Synthesis of 5-t-Butyl-4-[N-ethyl-N-(4-formyl-3-methylphenyl)aminoacetoxymethyl]-2-(4-N-methyl-N-octadecylsulfamoyl-2-nitrophenyl)-4-isooxazolin-3-one In 70 ml of dimethyl sulfoxide was dissolved 6.2 g of 5-t-butyl-4-chloromethyl-2-(4-N-methyl-N-octadecylsulfamoyl-2-nitrophenyl)-4-isooxazolin-3-one, and therewith were admixed 2.7 g of 4-(N-methyl-N-carboxymethylamino)-2-methylbenzaldehyde, 1.7 g of potassium carbonate and 0.4 g of sodium iodide. The resulting mixture underwent the reaction for 6 hours at room temperature, and thereinto was poured water. The reaction product was extracted with ethyl acetate, and the organic phase was washed twice with water. Then, the solvent was distilled away under reduced pressure, and the residue was recrystallized from methanol containing a small amount of acetonitrile. Yield: 7.2 g, Percent yield: 85.8%.

Step 5: Synthesis of Exemplified Compound 3-1

5.5 g of 5-t-butyl-4-[N-ethyl-N-(4-formyl-3-methylphenyl)aminoacetoxymethyl]-2-(4-N-methyl-N-octadecylsulfamoyl-2-nitrophenyl)-4-isooxazolin-3-one was mixed with methanol, and thereto were added 2.2 g of potassium 3-cyanoacetamidobenzenesulfonate and 0.7 g of ammonium acetate. The resulting mixture was heated under reflux for 3 hours. After cooling, the solvent was distilled away under reduced pressure, and the residue was dissolved in a mixture of chloroform and methanol and purified by column chromatography on silica gel. Yield: 4.0 g, Percent yield: 56.2%, $\lambda_{max}(CHCl_3)$: 425.8 nm, $\epsilon_{max}(CHCl_3)$: $3.73\times 10^4$.

The radiation responsive material of this invention contains the compound of formula (I) and a photoreducing agent capable of forming a redox couple together with said compound.

In this invention, the compound of formula (I) and a photoreducing agent are usable in a wide proportional range. For instance, a photoreducing agent can be used in an amount of from 0.05 to 50 mols, especially from 0.1 to 10 mols, per mol of the compound of formula (I).

Photoreducing agents which can be used in this invention are described in detail below.

The term "photoreducing agent" in this invention refers to the substance to produce a reducing agent (which can form a redox couple together with the compound represented by formula (I) in this invention) through the molecular photolysis or photo-induced rearrangement. More specifically, this reducing agent can reduce the compound of formula (I) immediately after irradiation with light, or when heated.

Among a great number of known photoreducing agents, those disclosed in JP-A-50-139722 are applicable to this invention.

Suitable examples of such photoreducing agents include disulfides, diazoanthrones, diazophenanthrones, aromatic carbazides, aromatic azides, diazonium salts, aromatic sulfonates, and quinones.

The photoreducing agents are described in more detail using quinones for an example.

Quinones are effective as the photoreducing agent of this invention. Preferred quinones include ortho- and para-benzoquinones, ortho- and paranaphthoquinones, phenanthrenequinones, and anthraquinones. These quinones may be substituted by any one or more of a substituent group so far as it does not hinder their function as the reducing agents as described hereinafter. Also, they may not have any substituent group. Of a wide variety of known substituents, those applicable to the foregoing quinones include the following substituent groups. However, applicable ones should not be construed as being limited to the groups cited below. The substituent groups are primary, secondary or tertiary alkyl, alkenyl, alkynyl, aryl, alkoxy, aryloxy, alkylaryloxy, hydroxyalkyl, hydroxyalkoxy, alkoxyalkyl, acyloxyalkyl, aryloxyalkyl, aroyloxyalkyl, aryloxyalkoxy, alkylcarbonyl, carbonyl, primary or secondary amino, aminoalkyl, amidoalkyl, anilino, piperidino, pyrrolidino, morpholino, nitro, halide and other analogous groups. Aryl substituents as described above are preferably phenyl substituent. Alkyl, alkenyl and alkynyl substituents may be present alone or in combination with other atoms, typically 20 (preferably 6) carbon atoms or less.

Representatives of specific quinones to be used in combination with another source for supplying active hydrogen atom are set forth in Table I.

TABLE I

| Representatives of Useful Quinones to Be Employed together with External Hydrogen Source | |
|---|---|
| I-1 | 2,5-Dimethyl-1,4-benzoquinone |
| I-2 | 2,6-Dimethyl-1,4-benzoquinone |
| I-3 | Duroquinone |
| I-4 | 2-(1-Formyl-1-methylethyl)-5-methyl-1,4-benzoquinone |
| I-5 | 2-(2-Cyclohexanoyl)-3,6-dimethyl-1,4-benzoquinone |
| I-6 | 1,4-Naphthoquinone |
| I-7 | 2-Methyl-1,4-naphthoquinone |
| I-8 | 2,3-Dimethyl-1,4-naphthoquinone |
| I-9 | 2,3-Dichloro-1,4-naphthoquinone |
| I-10 | 2-Thiomethyl-1,4-naphthoquinone |
| I-11 | 2-(1-Formyl-2-propyl)-1,4-naphthoquinone |
| I-12 | 2-(2-Benzoylethyl)-1,4-naphthoquinone |
| I-13 | 9,10-Phenanthrenequinone |
| I-14 | 2-t-Butyl-9,10-anthraquinone |
| I-15 | 2-Methyl-1,4-anthraquinone |
| I-16 | 2-Methyl-9,10-anthraquinone |

Photoreducing agents belonging to the preferred class are quinones of the kind which have a hydrogen supplying source inside thereof, that is, active hydrogen atom-containing quinones. Such quinones tend to be photoreduced with great ease, compared with quinones having no active hydrogen atom inside thereof. Quinones having a hydrogen supplying source inside thereof demonstrate extremely high photoreducibility whether they are used in combination with an external hydrogen-supplying source or not. In general, the combined use of internal hydrogen source quinones and external hydrogen source compounds can facilitate the photoreduction to a great extent. However, an effect produced by internal hydrogen source quinones is nothing but a small one when external hydrogen source compounds are absent.

When quinones extremely liable to be photoreduced are used, the image density of a photographic element can be increased so long as the exposure condition is the same, or a similar image density can be obtained even when an exposure time is shortened. Consequently, the use of internal hydrogen source quinones can increase a photographic speed, and/or an image density.

Representatives of preferred internal hydrogen source quinones are set forth in Table II.

TABLE II

| Representatives of Internal Hydrogen Source Quinones | |
|---|---|
| II-1 | 5,8-Dihydro-1,4-naphthoquinone |
| II-2 | 5,8-Dihydro-2,5,8-trimethyl-1,4-naphthoquinone |
| II-3 | 2,5-Bis(dimethylamino)-1,4-benzoquinone |
| II-4 | 2,5-Dimethyl-3,6-bis(dimethylamino)-1,4-benzoquinone |
| II-5 | 2-(1-Acetoxyethyl)-5-methyl-1,4-benzoquinone |
| II-6 | 2-(1-Methoxyethyl)-5-methyl-1,4-benzoquinone |
| II-7 | 2-(2-Methoxyethoxy)-1,4-naphthoquinone |
| II-8 | 2-(2-Ethoxyethoxy)-1,4-naphthoquinone |
| II-9 | 2-(2-Phenoxyethoxy)-1,4-naphthoquinone |
| II-10 | 2-Ethoxy-5-methoxy-1,4-naphthoquinone |

TABLE II-continued

| Representatives of Internal Hydrogen Source Quinones | |
|---|---|
| II-11 | 2-Ethoxy-6-methoxy-1,4-naphthoquinone |
| II-12 | 2-Ethoxy-7-methoxy-1,4-naphthoquinone |
| II-13 | 2-Dimethylamino-1,4-naphthoquinone |
| II-14 | 2-Methoxy-1,4-naphthoquinone |
| II-15 | 2-Benzoyloxy-1,4-naphthoquinone |
| II-16 | 2-Methoxy-3-chloro-1,4-naphthoquinone |
| II-17 | 2,3-Dimethoxy-1,4-naphthoquinone |
| II-18 | 2-n-Propoxy-1,4-naphthoquinone |
| II-19 | 2-(3-Hydroxypropoxy)-1,4-naphthoquinone |
| II-20 | 2-Isopropoxy-1,4-naphthoquinone |
| II-21 | 7-Methoxy-2-isopropoxy-1,4-naphthoquinone |
| II-22 | 2-n-Butoxy-1,4-naphthoquinone |
| II-23 | 2-sec-Butoxy-1,4-naphthoquinone |
| II-24 | 2-Methyl-5-morpholinomethyl-1,4-benzoquinone |
| II-25 | 2,3,5-Trimethyl-6-morpholinomethyl-1,4-benzoquinone |
| II-26 | 2,5-Bis(morpholinomethyl)-1,4-benzoquinone |
| II-27 | 2-(3-Methyl-n-butoxy)-1,4-naphthoquinone |
| II-28 | 2-(6-Hydroxy-n-hexyloxy)-1,4-naphthoquinone |
| II-29 | 2-Ethoxy-3-chloro-1,4-naphthoquinone |
| II-30 | 2-(Diphenylmethoxy)-1,4-naphthoquinone |
| II-31 | 2-(2-Hydroxyethoxy)-3-chloro-1,4-naphthoquinone |
| II-32 | 2-Methyl-3-(1-hydroxymethyl)ethyl-1,4-naphthoquinone |
| II-33 | 2-Bromo-3-isopropoxy-1,4-naphthoquinone |
| II-34 | 2-Ethoxy-3-methyl-1,4-naphthoquinone |
| II-35 | 2-Chloro-3-piperidino-1,4-naphthoquinone |
| II-36 | Sodium 2-isopropoxy-1,4-naphthoquinone-3,6-disulfonate |

Such photoreducing agents as cited above form redox couples together with the compound of formula (I) when exposed to active radiant rays. However, there are some differences in how to react them with each other and the reaction mechanism.

Many of the photoreducing agents react rapidly with the compound of formula (I) upon exposure to active radiant rays. Some of the quinone type photoreducing agents show this reaction characteristic. Other photoreducing agents, though also forming redox couples upon exposure, require a long time for reduction of the compound of formula (I). In many cases, it is to be desired that the reaction should be terminated in time by heating the redox couple formed from the exposed photoreducing agent and the compound of formula (I). The optimal temperature for heating the redox couple, though greatly depending on the photoreducing agent, the compound of formula (I) and other substances present in the reaction system, and the photographic speed specifically chosen, is typically within the range of from 80° C. to 150° C.

Adjuvants for the photoreducing agent to be used in this invention are described below.

The photoreducing agents to be used in this invention undergo an intramolecular rearrangement or a change in number of constituent atoms in the process of conversion into the reducing agents corresponding thereto. Internal hydrogen source quinones are representative of the photoreducing agents of such a kind that the ability to be converted into the corresponding reducing agent depends solely on the atoms present originally in the molecule. On the other hand, other photoreducing agents necessitate the presence of adjuvants, which can supply atoms necessary to enable the formation of the reducing agents, in order to convert them into the reducing agents corresponding thereto. For instance, it is necessary for quinones having no internal hydrogen source to be used together with an adjuvant which can function as an external source for supplying hydrogen atoms. For the purpose of accelerating the conversion of a photoreducing agent into the reducing agent, it has turned out that the combined use of the photoreducing agent and an adjuvant, e.g., an external hydrogen source, is effective whether atoms essential for the conversion into the reducing agent are present or not in the photoreducing agent.

Compounds which can be employed as the adjuvant as described above may be any known ones so far as they can provide active hydrogen atoms, and do not undergo any reactions with other constituents of a photographic element or their reaction products. Suitable adjuvants are organic compounds of the kind which have a hydrogen atom attached to a carbon atom having a substituent group, and liable to become active because of extreme weakness of the bonding between the hydrogen atom and the carbon atom. More desirable hydrogen source compounds are those having a hydrogen atom attached to such a carbon atom as to further bind to the oxygen atom of hydroxyl substituent or the trivalent nitrogen atom of an amine substituent. The term "amine substituent" is intended to include various amido and imino substituents. Typical examples of preferable substituent groups which can impart markedly high activity to a hydrogen atom attached to an ordinary carbon atom include oxy substituents such as hydroxyl, alkoxy, aryloxy, alkylaryloxy, and aralkoxy, and amino substituents such as alkylarylamino, diarylamino, amido, N,N-bis(1-cyanoalkyl)amino, N-aryl-N-(1-cyanoalkyl)amino, N-alkyl-N-(1-cyanoalkyl)amino, N,N-bis(1-carboalkoxyalkyl)amino, N-aryl-N-(1-carboalkoxyalkyl)amino, N-alkyl-N-(1-carboalkoxyalkyl)amino, N,N-bis(1-nitroalkyl)amino, N-alkyl-N-(1-nitroalkyl)amino, N-aryl-N-(1-nitroalkyl)amino, N,N-bis(1-acylalkyl)amino, N-alkyl-N-(1-acylalkyl)amino, and N-aryl-N-(1-acylalkyl)amino. Therein, aryl substituent groups or moieties are preferably phenyl or phenylene, while aliphatic hydrocarbon groups or moieties are preferably those containing not more than 20, particularly not more than 6, carbon atoms. Representatives of the compounds capable of readily providing active hydrogens, and that are applicable to this invention are set forth below. Known compounds useful in providing active hydrogens are described in U.S. Pat. No. 3,383,212, too.

TABLE III

| Representatives of External Hydrogen Source Compounds | |
|---|---|
| III-1 | Carboxymethyl cellulose |
| III-2 | Poly(vinyl formal) |
| III-3 | Phenyl-1,2-ethanediol |
| III-4 | Nitrilotriacetonitrile |
| III-5 | Triethylnitrilotriacetate |
| III-6 | Poly(ethylene glycol) |
| III-7 | Poly(vinyl butyral) |
| III-8 | Poly(vinyl acetal) |
| III-9 | 1,4-Benzenedimethanol |
| III-10 | Methyl cellulose |
| III-11 | Cellulose acetate butyrate |
| III-12 | 2,2-Bis(hydroxymethyl)propionic acid |
| III-13 | 1,3-Bis(hydroxymethyl)urea |
| III-14 | 4-Nitrobenzyl alcohol |
| III-15 | 4-Methoxybenzyl alcohol |
| III-16 | 2,4-Dimethoxybenzyl alcohol |
| III-17 | 3,4-Dichlorophenyl glycol |
| III-18 | N-(Hydroxymethyl)benzamide |
| III-19 | N-(Hydroxymethyl)phthalimide |
| III-20 | 5-(Hydroxymethyl)uracil hemihydrate |
| III-21 | Nitrilotriacetic acid |
| III-22 | 2,2',2''-Triethylnitrilotripropionate |
| III-23 | 2,2',2''-Nitrilotriacetophenone |
| III-24 | Poly(vinyl acetate) |
| III-25 | Poly(vinyl alcohol) |

TABLE III-continued

| Representatives of External Hydrogen Source Compounds | |
|---|---|
| III-26 | Ethyl cellulose |

The external hydrogen source adjuvants incorporated in the photographic element of this invention perform plural functions in practice. For instance, the above-cited polymers are used as not only binder, but also active hydrogen source. Herein, the above-cited compounds are intended as external hydrogen source compounds, and only emphasize the point that active hydrogen atoms need not be contained in the photoreducing agent used.

The radiation responsive composition of this invention is a solution of the combination of the compound of formula (I) and a photoreducing agent in a proper solvent, and coated in a film upon practical use. In coating, a binder component, such as various kinds of resins, may be added to the composition. In addition, a base or an acid, or a precursor thereof, a dispersing aid (e.g., high boiling oils or surfactants), and so on may be incorporated in the film.

Moreover, the composition can be made into moldings, or used in a solution state.

The radiation responsive compositions containing the compound represented by formula (I) of this invention can be applied to a wide variety of image-forming methods, etching, metal plating, and so on, as given hereinbefore as the examples of uses, (1) to (9).

In accordance with this invention, there can be obtained radiation responsive compositions capable of fulfilling properly various functions in answer to purposes by irradiation with radiant rays.

The invention will now be illustrated in more detail by reference to the following examples.

EXAMPLE 1

On a polyethylene terephthalate support were coated the layers described below in this order to prepare Sample 1.

(1) Mordanting layer containing 3.0 $g/m^2$ of gelatin, and 3.0 $g/m^2$ of the polymer latex mordant illustrated below.

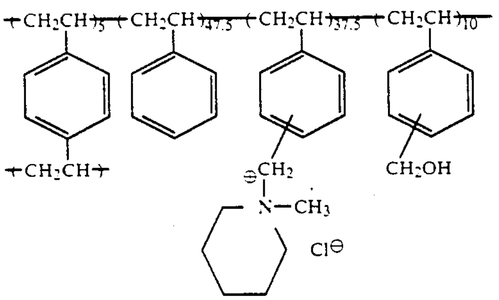

(2) Layer containing 0.5 $g/m^2$ of hydroxyethyl cellulose.

(3) Layer containing 1.0 $g/m^2$ of Compound 1-2, 1.5 $g/m^2$ of (I-14) as photoreducing agent, 0.05 $g/m^2$ of tricyclohexyl phosphate, and 2.0 $g/m^2$ of gelatin.

The thus obtained Sample 1 was irradiated with (exposed to) light for 2 minutes using a xenon lamp of 500 watts as light source through a wedge of continuous tone, and allowed to stand for 30 minutes under the condition of 60° C., 90% RH. After a linear incision was made in the coat of this sample with a cutting knife, tacky tape was uniformly applied thereto. Then, the tape was peeled apart therefrom. Thereupon, the layer (3) containing the coloring material was taken away by the tacky tape, while the layer (1), i.e., the mordanting layer, remained on the support. In the resulting mordanting layer, the production of a negative image of magenta color (wherein the image density was higher in the area which had been exposed to the larger quantity of light, and lower in the area which had been exposed to the smaller quantity of light) was clearly observed.

The transmission density measurement of this color image resulted in Dmax=2.0 and Dmin=0.08.

EXAMPLE 2

Sample 2 was prepared in the same manner as Sample 1 in Example 1, except that the layer (2) was not provided and that in the layer (3) was used 2.0 $g/m^2$ of hydroxyethyl cellulose instead of gelatin.

The thus prepared Sample 2 was processed under the same condition as in Example 1, except that the exposure was performed through a fine pattern for resolution test instead of a wedge of continuous tone. Thereupon, a very sharp image was obtained in the layer (1) remaining on the support.

In the examination of this image under a microscope, fine lines with a width of at least 5 μm were observed distinctly.

EXAMPLE 3

On a polyethylene support, the layers described below were coated to prepare Sample 3.

(1) Layer containing 1.0 $g/m^2$ of Compound 1-3, 1.5 $g/m^2$ of the photoreducing agent (II-36), 0.05 $g/m^2$ of tricyclohexyl phosphate, and 2.0 $g/m^2$ of gelatin.

(2) Protective layer containing 0.5 $g/m^2$ of gelatin, and 0.02 $g/m^2$ of triacryloyltriazine as a hardener.

After exposure under the same condition as in Example 1, the sample was soaked in a buffer solution adjusted to pH 10.0 (Britton-Robinson's) for 10 minutes, washed with water for 30 seconds, and air-dried at room temperature.

In this sample, a positive yellow image (with lower density in the area which had been exposed to the larger quantity of light) was produced.

This is because the dye released by the photoreaction is eluted with the buffer solution, and the coloring material present in the area which had been exposed to a small quantity of light remains as it is, without undergoing the photoreaction, and consequently without releasing the dye.

EXAMPLE 4

On a polyethylene terephthalate film (100 μm in thickness) provided with an undercoat, the coating composition described below was coated, and dried with warm air to form a film with a dry thickness of 4.0 μm (Sample A).

| | |
|---|---|
| Gelatin | 2.5 g |
| Compound 1-14 of this Invention | 1.8 g |
| Photoreducing Agent (II-36) | 1.8 g |
| Mucochloric Acid (1% aq. soln.) | 3 ml |
| Water | 50 ml |

Separately, poly(methyl acrylate-co-N,N,N-trimethyl-N-vinylbenzylammonium chloride) (in which the ratio of methyl acrylate to vinylbenzylammonium chloride was 1:1) was coated in a layer with a dry thickness of 3.0 μm on a support which had been prepared by providing a polyethylene film with a thickness of 80 μm on both sides of paper, and then making the film surface hydrophilic by a corona discharge treatment (to prepare Sample B).

Sample A was exposed imagewise for 70 seconds by means of a high pressure mercury vapor lamp, dampened with water, brought into the face-to-face contact with Sample B, and allowed to stand for 60 seconds. When Sample A and Sample B were delaminated from each other, a magenta dye image was formed in Sample B corresponding to the exposed areas of Sample A, while the density in the exposed areas of Sample A was reduced to one-sixth or less that in the unexposed areas.

EXAMPLE 5

On a subbed polyethylene terephthalate film (100 μm in thickness), a coating solution prepared by dissolving in 5 ml of ethyl alcohol 0.1 g of Compound 1-21 of this invention, 0.08 g of the photoreducing agent (I-14) and 0.2 g of polyvinyl butyral resin was coated with a rod bar to form a film with a dry thickness of 3.4 μm (Sample C). Separately, a coating solution containing a copolymer constituted by 50 mol% of styrene and 50 mol% of trihexylaminomethylstyrene was coated in a layer with a dry thickness of 30 μm on another subbed polyethylene terephthalate film (20 μm in thickness) (to prepare Sample D).

Sample C was exposed imagewise for 70 seconds by means of a xenon lamp, brought into the face-to-face contact with Sample D, and heated at 100° C. for 12 seconds. When Sample C and Sample D were delaminated from each other, a yellow dye image was formed in Sample D corresponding to the exposed areas of Sample C, while the density in the exposed areas of Sample C was reduced to one-tenth or less that in the unexposed areas.

EXAMPLE 6

On a silicon wafer was provided silicon dioxide in a thickness of 400 Å using the CVD method. Thereon, a solution prepared by dissolving in 5 ml of ethyl alcohol 0.5 g of Compound 5-6 of this invention, 0.4 g of the photoreducing agent (II-20) and 0.3 g of alcohol-soluble polyvinyl butyrate was coated with a spinner, dried, and then exposed for 10 minutes to light of a high pressure mercury vapor lamp of 150 watts through a mask. Thereafter, dissolution of the coated film was tried with a solution obtained by adding 1 ml of hydrochloric acid to 10 ml of ethyl alcohol, resulting in the etching of the silicon dioxide which had been present in the irradiated areas.

EXAMPLE 7

One gram of polyvinyl butyral was dissolved in 7 ml of ethyl alcohol and 3 ml of ethyl acetate, and therein were further dissolved 0.7 g of Compound 6-2 of this invention and 0.6 g of the photoreducing agent (I-13) to prepare a coating solution (11).

On a glass substrate, a solution of 0.1 g of nickel chloride and 0.5 g of polyvinyl formal resin in dimethylformamide was coated in a dry thickness of 2 μm. On this coat, the foregoing coating solution (11) was coated with a spinner (in a dry thickness of 2 μm). The thus obtained coat was exposed to xenon light through a density mask for 40 seconds, and then the upper layer alone was removed by dissolution, followed by the dip in a nonelectrolytic silver-plating bath. Thereupon, silver was deposited on the exposed areas alone. It is thought that this phenomenon results from the production of a sulfur-containing nickel compound to function as plating nuclei in the exposed areas alone.

EXAMPLE 8

An ABS resin plate was soaked in a surface roughening solution for 10 minutes, and then dipped for 1 minute in a catalyst providing solution containing 30 g/liter of tin dichloride and 20 ml/liter of hydrochloric acid, and further dipped for 90 seconds in an activating solution containing 0.25 g/liter of palladium chloride and 4 ml/liter of hydrochloric acid to result in the deposition of metallic palladium on the surface of the ABS resin. On the thus processed plate, a solution prepared by dissolving 0.8 g of Compound 6-9 of this invention and 1.2 g of the photoreducing agent (I-13) in 10 ml of a 4% ethyl alcohol solution of polyvinylpyrrolidone was coated with a spinner. Though it was not able to be completely dried, the coat formed was almost solid. It was exposed for 3 minutes to the g-line of a mercury vapor lamp through an enlargement exposure, and then subjected to the removal with warm water. The resulting plate was dipped for 90 seconds at room temperature in a commercially available nonelectrolytic copperplating bath. Thus, the unexposed areas were copperplated. Therefore, palladium is supposed to have been deactivated in the exposed areas.

EXAMPLE 9

In a mixture of 7 ml of toluene and 3 ml of methyl cellosolve were dissolved 1.0 g of Compound 10-1 of this invention and 0.8 g of photoreducing agent (II-20) to prepare a coating solution. The resulting solution was coated on a substrate prepared by evaporating silicon dioxide in a layer of 800 Å onto a silicon wafer under vacuum, and then subjecting to a pretreatment with hexamethinedisilazane. In the coating, a spin coating method was used. Thus, a photoresist film with a dry thickness of 1.0 μm was obtained. The photoresist film was placed on a hot plate, and prebaked at 90° C. for 30 seconds. Thereafter, it was exposed for 12 seconds through a proximity test pattern by means of a Canon ® PLA-520 equipped with an ultrahigh pressure mercury vapor lamp, and further subjected to a post-bake at 140° C. for 50 seconds.

Subsequently, the thus processed photoresist film was developed for 30 seconds with an alkaline developer containing tetraethylammonium hydroxide, resulting in the formation of a pattern to enable the resolution of 1.5 μm line and space.

EXAMPLE 10

On a subbed polyethylene terephthalate film (with a thickness of 100 μm), the coating solution described below was coated, and dried with warm air to form a yellow film with a dry thickness of 2.5 μm.

| | |
|---|---|
| Polyvinyl Butyral | 1.0 g |
| Compound 2-12 of this Invention | 1.2 g |
| t-Butylbenzophenone | 1.0 g |
| Ethyl Alcohol | 9.0 ml |
| Butyl Alcohol | 1.0 ml |

Separately, a solution of 1.0 g of polyvinyl butyral and 0.6 g of nickel chloride in 8 ml of ethyl alcohol was coated on a polyethylene terephthalate film (thickness:

20 $\mu$m) to prepare an image-receiving sheet with a thickness of 3.0 $\mu$m.

The coat containing the compound of this invention was imagewise exposed for 50 seconds by means of a xenon lamp of 1 kW through the foregoing 100 $\mu$m thick polyethylene terephthalate film, and then the film and the image-receiving sheet were brought into the face-to-face contact with each other and heated at 150° C. for 12 seconds. Thereafter, the image-receiving sheet was peeled apart.

In the image-receiving sheet, a magenta color image was formed corresponding to the exposed areas, and the magenta color showed its maximum absorption at the wavelength of 530 nm and an optical density of 0.95 in the measurement with a Macbeth densitometer to which a gray filter was attached.

While the invention has been described in detail and with reference to specific embodiments thereof, it will be apparent to one skilled in the art that various changes and modifications can be made therein without departing from the spirit and scope thereof.

What is claimed is:

1. A radiation responsive composition comprising a compound represented by the following formula (I) and a photoreducing agent capable of forming a redox couple together with said compound:

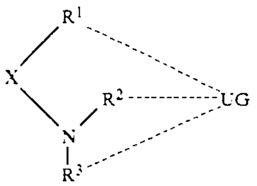

(I)

wherein N represents a nitrogen atom; X represents an oxygen atom (—O—), a sulfur atom (—S—), or a nitrogen-containing group of formula,

$R^1$, $R^2$, $R^3$ and $R^4$ each represents a mere bond, a substituted or unsubstituted alkyl, aryl, heterocyclic, acyl, aralkyl, alkenyl, alkynyl or carbamoyl group, or a sulfonyl group into which a substituted or unsubstituted alkyl or aryl group has been introduced, provided that at least one of the substituents $R^1$ to $R^3$ be a substituted or unsubstituted aryl or heterocyclic group and that two or more of $R^1$, $R^2$ and $R^3$, or of $R^1$, $R^2$, $R^3$ and $R^4$ when X represents a nitrogen containing group of formula,

may be taken together to form a ring; UG represents a group to be released from said compound of formula (I) taking advantage of the N—X bond cleavage as a trigger, which takes place when a redox couple is formed between said compound of formula (I) and the photoreducing agent irradiated with radiant rays; and the solid lines represent bonds, while broken lines indicate that a bond may or may not be present, but at least one of the broken lines forms a bond.

2. A radiation responsive composition comprising a compound represented by the following formula (II) and a photoreducing agent capable of forming a redox couple together with said compound:

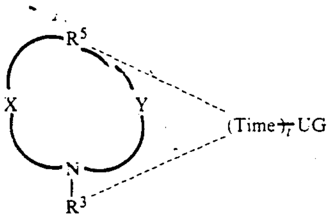

(II)

wherein N represents a nitrogen atom; X represents an oxygen atom (—O—), a sulfur atom (—S—), or a nitrogen-containing group of formula,

$R^3$ is a substituted or unsubstituted aryl or heterocyclic group; $R^4$ represents a mere bond, a substituted or unsubstituted alkyl, aryl, heterocyclic, acyl, aralkyl, alkenyl, alkynyl or carbamoyl group, or a sulfonyl group into which a substituted or unsubstituted alkyl or aryl group has been introduced, provided that $R^3$ and $R^4$ when X represents a nitrogen containing group of formula,

may be taken together to form a ring; UG represents a group to be released from said compound of formula (II) taking advantage of the N—X bond cleavage as a trigger, which takes place when a redox couple is formed between said compound of formula (II) and the photoreducing agent irradiated with radiant rays; and the solid lines represent bonds, while broken lines indicate that a bond may or may not be present, but at least one of the broken lines forms a bond; Y is a divalent linkage group; $R^5$ is attached to X and Y, and represents an atomic group necessary for completing a nitrogen-containing 5- to 8-membered single or condensed hetero ring; Time represents a group capable of releasing UG when a redox couple is formed between said compound of formula (II) and the irradiated photoreducing agent; and t is 0 or 1.

3. The radiation responsive composition of claim 1, wherein at least one of $R^1$ and $R^3$ is an aryl group or a heterocyclic group.

4. The radiation responsive composition of claim 3, wherein the aryl group or heterocyclic group is substituted by at least one group having a positive Hammett's $\lambda_p$.

5. The radiation responsive composition of claim 3, wherein the aryl group or heterocyclic group is a phenyl group, a naphthyl group, an anthranyl group, a pyridyl group, a pyrazinyl group, a pyrimidyl group, a benzothiazolyl group, a benzoxazolyl group, an imidazolyl group, a thiazolyl group, an azaindenyl group, an indenyl group, a pyrrolyl group, or a phenylthio group.

6. The radiation responsive composition of claim 4, wherein the substituent is a substituted or unsubstituted carbamoyl, sulfonyl, sulfamoyl, alkoxycarbonyl, acyl, ammonio, azo, sulfinyl, nitro, cyano, trifluoromethyl, or nitroso group, or a fluorine atom, a chlorine atom, or a bromine atom.

7. The radiation responsive composition of claim 2, wherein Y is —(C═O)— or —$SO_2$—.

8. The radiation responsive composition of claim 1, wherein UG is a diffusible dye, a ligand of a metal complex, an UV absorber, an IR absorber, a light-fast protecting compound, a colorless compound, an etchant, a metal plating inactivator, a metal plating heightener, a mordanting site, a base precursor or a contrast enhancer.

9. The radiation responsive composition of claim 1, wherein UG is a diffusible dye or a dye whose absorption wavelength is shifted by redox coupling.

10. The radiation responsive composition of claim 1, wherein the photoreducing agent is used in an amount of from 0.05 to 50 mols per mol of said compound of formula (I).

11. The radiation responsive composition of claim 10, wherein the photoreducing agent is used in an amount of from 0.1 to 10 mols per mol of said compound of formula (I).

12. The radiation responsive composition of claim 1, wherein the photoreducing agent is selected from the group consisting of disulfides, diazoanthrones, diazophenanthrones, aromatic carbazides, aromatic azides, diazonium salts, aromatic sulfonates, and quinones.

13. The radiation responsive composition of claim 12, wherein the photoreducing agent is a quinone.

14. The radiation responsive composition of claim 13, wherein the quinone is selected from the group consisting of ortho- and para-benzoquinones, ortho- and para-naphthoquinones, phenanthrenequinones, and anthraquinones.

15. The radiation responsive composition of claim 13, wherein the quinone is an internal hydrogen source quinone.

16. The radiation responsive composition of claim 13, wherein an external hydrogen source material is present, the quinone comprising a quinone to be used as a photoreducing agent in combination with an external hydrogen source.

17. The radiation responsive composition of claim 13, wherein the composition includes an internal hydrogen source quinone and a quinone to be used as a photoreducing agent in combination with an external hydrogen source.

18. The radiation responsive composition of claim 13, wherein the quinone comprises an internal hydrogen source quinone that is a 5,8-dihydro-1,4-naphthoquinone having at least 15 hydrogen atoms at either the 5- or the 8-position of the ring.

19. A film carrying a coating comprising the composition of claim 1.

20. An image-forming method comprising imagewise exposing with radiant rays the composition of claim 1.

* * * * *